(12) United States Patent
Takata et al.

(10) Patent No.: US 9,555,628 B2
(45) Date of Patent: Jan. 31, 2017

(54) INKJET DEVICE, AND METHOD FOR MANUFACTURING ORGANIC EL DEVICE

(71) Applicant: PANASONIC CORPORATION, Osaka (JP)

(72) Inventors: Masakazu Takata, Osaka (JP); Hirotaka Nanno, Kyoto (JP); Yoshie Takahashi, Osaka (JP); Shinichiro Ishino, Osaka (JP); Noriyuki Matsusue, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 147 days.

(21) Appl. No.: 14/400,949

(22) PCT Filed: Jun. 4, 2013

(86) PCT No.: PCT/JP2013/003500
§ 371 (c)(1),
(2) Date: Nov. 13, 2014

(87) PCT Pub. No.: WO2013/183282
PCT Pub. Date: Dec. 12, 2013

(65) Prior Publication Data
US 2015/0132879 A1 May 14, 2015

(30) Foreign Application Priority Data
Jun. 6, 2012 (JP) .................................. 2012-129268

(51) Int. Cl.
*B41J 2/045* (2006.01)
*H05B 33/10* (2006.01)
(Continued)

(52) U.S. Cl.
CPC ......... *B41J 2/04588* (2013.01); *B41J 2/04581* (2013.01); *B41J 2/04596* (2013.01);
(Continued)

(58) Field of Classification Search
CPC . B41J 2/04588; B41J 2/04596; B41J 2/04581; H01L 51/56; H01L 51/0005; H01L 51/5012; H05B 33/10
See application file for complete search history.

(56) References Cited

U.S. PATENT DOCUMENTS 5,443,922 A     8/1995   Nishizaki et al.
5,984,448 A * 11/1999   Yanagawa ............ B41J 2/04581
                                                     347/10
(Continued)

FOREIGN PATENT DOCUMENTS

JP    02-192947    7/1990
JP    05-163488    6/1993
(Continued)

OTHER PUBLICATIONS

Search report from International Patent Application No. PCT/JP2013/003500 mailed Aug. 20, 2013.

*Primary Examiner* — Alessandro Amari
*Assistant Examiner* — Roger W Pisha, II
(74) *Attorney, Agent, or Firm* — Greenblum & Bernstein, P.L.C.

(57) ABSTRACT

An ink jet device includes a plurality of ink jet heads each including an ink housing unit that houses therein ink, a pressure application unit that ejects a droplet of the ink by applying pressure to the ink, and a nozzle through which the droplet of the ink is ejected, wherein with respect to at least one of the plurality of ink jet heads, a preliminary drive operation and a main drive operation are performed, the preliminary drive operation is an operation of pushing the (Continued)

ink toward an outer edge of the nozzle to the extent that the droplet of the ink is not ejected through the nozzle, and the main drive operation is an operation of ejecting the droplet of the ink through the nozzle after performance of the preliminary drive operation.

11 Claims, 16 Drawing Sheets

(51) Int. Cl.
    *H01L 51/00*      (2006.01)
    *H01L 51/56*      (2006.01)
    *H01L 51/50*      (2006.01)

(52) U.S. Cl.
    CPC .......... *H01L 51/0005* (2013.01); *H01L 51/56* (2013.01); *H05B 33/10* (2013.01); *H01L 51/5012* (2013.01)

(56) References Cited

U.S. PATENT DOCUMENTS

| | | | |
|---|---|---|---|
| 9,299,959 B2 * | 3/2016 | Goto | ........................ H01L 51/56 |
| 2004/0239721 A1 | 12/2004 | Usuda | |
| 2007/0257949 A1 | 11/2007 | Usuda | |
| 2010/0118073 A1 * | 5/2010 | Kitami | ................. B41J 2/04543 347/10 |
| 2010/0302296 A1 | 12/2010 | Ito et al. | |
| 2011/0205273 A1 * | 8/2011 | Hibino | ................. B41J 2/04581 347/10 |

FOREIGN PATENT DOCUMENTS

| | | |
|---|---|---|
| JP | 09-226106 | 9/1997 |
| JP | 2001-296420 | 10/2001 |
| JP | 2004-275956 | 10/2004 |
| JP | 2010-142675 | 7/2010 |
| JP | 2010-142676 | 7/2010 |
| JP | 2011-008228 | 1/2011 |

\* cited by examiner

INKJET DEVICE, AND METHOD FOR MANUFACTURING ORGANIC EL DEVICE

TECHNICAL FIELD

The present invention relates to an ink jet device and a manufacturing method of an organic EL device with use of the ink jet device.

BACKGROUND ART

There have been known several drive systems for ejecting ink droplets with use of an ink jet device, such as a pump system, a piezoelectric system, and a thermal system. According to the piezoelectric system, pressure is applied to ink housed in an ink housing unit and an ink droplet is ejected through the nozzle, by application of a voltage signal (drive voltage) to a piezoelectric element provided in the ink housing unit to reversibly expand or shrink the ink housing unit.

In recent years, ink jet devices are applied to, for example, a field of printing appliances for home use. Also, ink jet devices are used in an industrial field where ink droplets need to be precisely ejected on a large-size substrate for a short time period in a manufacturing process of organic EL (Electro Luminescence) devices and so on. In order to eject ink droplets by an ink jet device for a short time period with high precision, it is necessary to increase the number of times of ink droplet ejection per unit time (hereinafter, referred to also as repetition frequency of ink droplet ejection) and improve landing accuracy of an ink droplet to be ejected. To that end, the following technical problems need to be solved.

Since it is difficult to control volume of an ink droplet at present, an ink droplet having volume smaller than a defined volume can be ejected. There is a case where such an ink droplet having the smaller volume tends to fly in various directions through a nozzle, and as a result landing accuracy deteriorates. Furthermore, in the case where a precedent ink droplet, which has volume smaller than the defined volume, adheres near the nozzle and then a subsequent ink droplet comes into contact with the precedent ink droplet, the precedent ink droplet is combined with the subsequent ink droplet, and surface tension thereof deflects a straight flight course of the subsequent ink droplet. This might extremely deteriorate landing accuracy.

In response to these technical problems, Patent Literatures 1 and 2 each disclose a method with use of an ink jet device employing the piezoelectric system for example.

CITATION LIST

Patent Literature

[Patent Literature 1] Japanese Patent Application Publication No. 2-192947
[Patent Literature 2] Japanese Patent Application Publication No. 9-226106

SUMMARY OF INVENTION

Technical Problem

According to the methods disclosed in Patent Literatures 1 and 2, modification is performed on one pulse shape of voltage to be applied to a piezoelectric element for ink droplet ejection, However, it is in fact difficult to solve the above problems by these methods.

According to the methods disclosed in Patent Literatures 1 and 2, a rising speed and a falling speed of pulse of voltage to be applied for ink droplet ejection are set comparatively low in order to improve landing accuracy of an ink droplet. Furthermore, pulse width is reduced in order to increase repetition frequency of ink droplet ejection and set frequency of drive voltage high. In this way, the methods disclosed in Patent Literatures 1 and 2 require extremely complicated operations. Also, since ejection behavior of an ink droplet differs depending on physical properties of ink such as viscosity, there is a case where inks having different physical properties cannot be supported only by adjusting pulse of voltage to be applied for ink droplet ejection.

Accordingly, there is a demand for solution of the above problem of deterioration in landing accuracy of an ink droplet. Also, ink droplet ejection with excellent landing accuracy is desired with respect to ink jet devices employing other drive systems as well as ink jet devices employing the piezoelectric system.

The present invention was made in view of the above problems, and aims to provide an ink jet device and a manufacturing method of an organic EL device that are capable of controlling ink droplet ejection even by applying drive voltage of high frequency, and exhibiting high landing accuracy of an ink droplet.

Solution to Problem

In order to solve the above aim, one aspect of the present invention provides an ink jet device comprising a plurality of ink jet heads each including an ink housing unit that houses therein ink, a pressure application unit that ejects a droplet of the ink by applying pressure to the ink, and a nozzle through which the droplet of the ink is ejected, wherein with respect to at least one of the plurality of ink jet heads, a preliminary drive operation and a main drive operation are performed, the preliminary drive operation is an operation of pushing the ink toward an outer edge of the nozzle to the extent that the droplet of the ink is not ejected through the nozzle, and the main drive operation is an operation of ejecting the droplet of the ink through the nozzle after performance of the preliminary drive operation.

Advantageous Effects of Invention

According to the ink jet device relating to the aspect of the present invention, with respect to at least one of the plurality of ink jet heads, the preliminary drive operation and the main drive operation are performed. The preliminary drive operation is an operation of pushing the ink toward the outer edge of the nozzle to the extent that the droplet of the ink is not ejected through the nozzle. The main drive operation is an operation of ejecting the droplet of the ink through the nozzle after performance of the preliminary drive operation. By performing the preliminary drive operation in this way, it is possible to give motion energy to an ink droplet before the main drive operation is performed. Accordingly, even in the case where a precedent ink droplet adheres near the nozzle and then a subsequent ink droplet comes into contact with the precedent ink droplet, straight flight of the subsequent ink droplet is ensured owing to the given motion energy, and deflection of a flight course of the subsequent ink droplet is prevented. Also, even in the case where pressure application performed by the pressure application unit is controlled with use of the piezoelectric element for example, the above effects are obtained irrespective of frequency of voltage to be applied to the piezoelectric element. Furthermore, motion energy is given to an ink droplet without so much depending on physical properties of ink such as viscosity.

Accordingly, it is possible to improve landing accuracy of an ink droplet by selectively performing the preliminary drive operation with respect to, among the plurality of ink jet heads, at least one ink jet head through which an ink droplet having the defined volume is not ejected and shows lower landing accuracy.

According to the present invention, therefore, it is possible to provide an ink jet device and a manufacturing method of an organic EL device that are capable of controlling ink droplet ejection even by applying drive voltage of high frequency, and exhibiting high landing accuracy of an ink droplet.

BRIEF DESCRIPTION OF DRAWINGS

FIG. 6A shows drive waveform including a main oscillatory waveform part corresponding to a push-ejection method, FIG. 6B shows drive waveform not including an oscillation suppression waveform part, and FIG. 6C shows drive waveform including a preliminary oscillatory waveform part corresponding to the push-ejection method.

DESCRIPTION OF EMBODIMENTS

Figure 1:
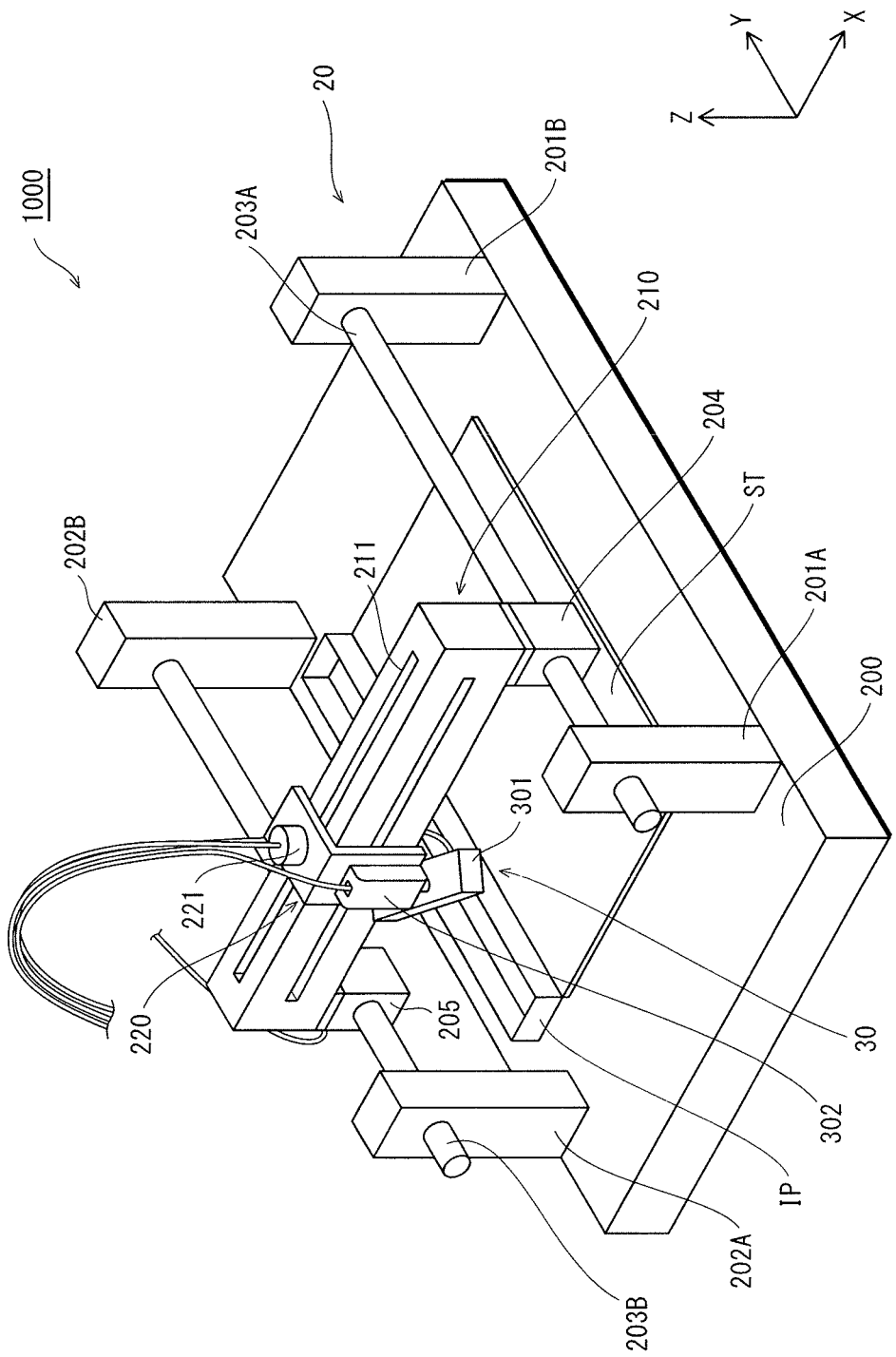
FIG. 1 shows the primary configuration of an ink jet device 1000 relating to an embodiment of the present invention.

Process by which the Present Invention is Achieved

As described above, landing accuracy of an ink droplet deteriorates through a process in which a precedent ink droplet having volume smaller than the defined volume flies and adheres near a nozzle, and then is combined with a subsequent ink droplet, and the precedent ink droplet and the subsequent ink droplet, which are combined together, fly due to surface tension thereof, and as a result a flight direction thereof is deflected.

The present inventor examined that this process is caused by application of ununiform positive pressure to an ink surface for ink droplet ejection with use of an ink jet device. Then, as a result of consideration of a method of suppressing deterioration of landing accuracy of an ink droplet, the present inventor got the findings that it is possible to suppress generation of an ink droplet having volume smaller than the defined volume, and eject an ink droplet having sufficient motion energy and the defined volume, by pushing ink before ejection of an ink droplet through the nozzle to the extent that an ink droplet is not ejected through the nozzle. Even when an ink droplet to be ejected is combined with ink adhering near the nozzle, it is possible to suppress an influence of surface tension of the adhering ink by giving sufficient motion energy to the ink droplet to be ejected. This effectively prevents deflection of a flight course of the ink droplet.

Note that an ink surface having the meniscus (bent) shape is considered to cause generation of an ink droplet having volume smaller than the defined volume and deterioration of landing accuracy of the ink droplet. According to the present invention, in view of this, ink is pushed toward the outer edge of the nozzle before an ink droplet is ejected to the extent that the ink droplet is not ejected. As a result, the meniscus shape is canceled and the ink surface is flattened. This suppresses generation of an ink droplet having volume smaller than the defined volume and deterioration of the landing accuracy of the ink droplet.

<Outline of One Aspect of the Present Invention>

The aspect of the present invention provides an ink jet device comprising a plurality of ink jet heads each including an ink housing unit that houses therein ink, a pressure application unit that ejects a droplet of the ink by applying pressure to the ink, and a nozzle through which the droplet of the ink is ejected, wherein with respect to at least one of the plurality of ink jet heads, a preliminary drive operation and a main drive operation are performed, the preliminary drive operation is an operation of pushing the ink toward an outer edge of the nozzle to the extent that the droplet of the ink is not ejected through the nozzle, and the main drive operation is an operation of ejecting the droplet of the ink through the nozzle after performance of the preliminary drive operation.

Ejection behavior of an ink droplet from an ink housing unit included in each ink jet head varies over time due to the status of ink and variation in shape of a nozzle of the ink jet head. Accordingly, it is difficult to uniformly control ejection behavior of ink droplets ejected from a plurality of ink jet heads. According to the aspect of the present invention, in view of this, the preliminary drive operation is selectively performed with respect to, among the plurality of ink jet heads, at least one ink jet head through which an ink droplet having the defined volume is not ejected and shows lower landing accuracy. In the preliminary drive operation, ink housed in the ink housing unit is pushed toward the outer edge of the nozzle to the extent that an ink droplet is not ejected. This improves landing accuracy of the ink droplet to be ejected in the main drive operation. Also, even in the case where ink adheres near the nozzle of the ink jet device for example, it is possible to give motion energy to a subsequent ink droplet to effectively prevent deflection of a flight course of the subsequent ink droplet, thereby improving landing accuracy of the subsequent ink droplet. Note that even in the case where pressure application performed by the pressure application unit is controlled with use of the piezoelectric element, the above effects are obtained irrespective of frequency of voltage to be applied to the piezoelectric element. According to the aspect of the present invention, therefore, it is possible to support even the case where an ink droplet is ejected by application of drive voltage of high frequency.

The following describes in detail the preliminary drive operation relating to the aspect of the present invention. According to the inkjet method, pressure is applied to ink housed in the ink housing unit in order to generate a propagation wave in the ink. As a result, an ink droplet is ejected through a nozzle. An ink surface has a meniscus shape such that pressure in the ink and surface tension of the ink surface are held in equilibrium. This is considered to cause ununiform energy of the propagation wave on the ink surface, and cause the highest amplitude of oscillation around the vertex position of the meniscus shape of the ink surface. As a result, volume of an ink droplet to be ejected tends not to be constant, and an ink droplet having volume smaller than the defined volume might be ejected, or an ink droplet might be ejected in various directions. In view of this, according to the aspect of the present invention, the preliminary drive operation is performed to flatten the meniscus shape of the ink surface before ejection of an ink droplet. Accordingly, even in the case where oscillation occurs on the ink surface, it is possible to suppress amplitude of the oscillation and apply uniform positive pressure to the ink surface for excellent ejection of the ink droplet.

The following describes a further preferable aspect of the present invention in consideration of the meniscus shape of the ink surface based on the aspect of the present invention. With respect to at least one of the plurality of ink jet heads which is selected as a target for the preliminary drive operation, the preliminary drive operation is performed for pushing ink housed in the ink housing unit toward the outer edge of the nozzle such that the vertex position of the meniscus shape of an ink surface moves toward the edge of the nozzle, and then the main drive operation is performed for ejecting an ink droplet. Through performance of the preliminary drive operation, the ink housed in the ink housing unit is pushed toward the outer edge of the nozzle such that the meniscus shape of the ink surface is flattened. This makes it possible to apply uniform positive pressure to the ink surface in order to eject the ink droplet in the main drive operation, thereby ejecting the ink droplet having the defined volume and further improving landing accuracy of the ink droplet.

Note that in the case where repetition frequency of voltage for ink droplet ejection to be applied by the pressure application unit increases, a certain amount of ink can adhere near the nozzle even after the preliminary drive operation is performed. According to the further preferable aspect of the present invention, however, sufficient motion energy is given to a subsequent ink droplet to the extent that surface tension of the ink adhering near the nozzle can be ignored. This further effectively prevents deflection of a flight course of the subsequent ink droplet. According to the further preferable aspect of the present invention, therefore, even in the case where an ink droplet is ejected by application of drive voltage of high frequency, landing accuracy of the ink droplet can be improved.

Also, according to a preferable aspect of the ink jet device relating to the aspect of the present invention, the pressure application unit included in the at least one ink jet head may have a piezoelectric element for applying pressure to the ink, the ink jet device may further comprise an ejection control unit that controls ejection of the droplet of the ink by applying voltage to the piezoelectric element according to a voltage waveform, and the voltage waveform of the voltage may include a preliminary oscillatory waveform part for performing the preliminary drive operation and a main oscillatory waveform part for performing the main drive operation.

According to the piezoelectric system with the piezoelectric element, an ejection amount and volume of an ink droplet are controlled in accordance with a variation amount of the piezoelectric element. It is possible to perform such control with comparative precision by adjusting voltage to be applied to the piezoelectric element. For this reason, the piezoelectric system is expected to be applied to especially a technical field with a demand for short-time ejection with high precision.

According to the piezoelectric system, however, an ink surface tends to have the meniscus shape because the ink housing unit is a fine tube. Accordingly, ejection behavior of an ink droplet is difficult to control, and this might cause a problem in ensuring landing accuracy of the ink droplet. According to the preferable aspect of the present invention, in view of this, the pressure application unit includes the piezoelectric element, and controls pressure to be applied to ink housed in the ink housing unit by the ejection control unit that controls voltage to be applied to the piezoelectric element. Also, the voltage waveform of voltage in the ink jet head with respect to which the preliminary drive operation is performed includes the preliminary oscillatory waveform part for performing the preliminary drive operation and the main oscillatory waveform part for performing the main drive operation. It is possible to improve landing accuracy of an ink droplet irrespective of frequency of drive voltage by performing the preliminary drive operation. Also, it is possible to improve the landing accuracy of the ink droplet only by applying voltage corresponding to the preliminary oscillatory waveform part, which is independent from the main oscillatory waveform part. This increases a degree of freedom of waveform width of the main oscillatory waveform part. As a result, it is possible to set the waveform width of the main oscillatory waveform part in order to, for example, increase frequency of the drive voltage.

More detailed description is given as follows. According to the piezoelectric system, since an ink housing unit is a fine tube, the meniscus shape of an ink surface is particularly curved. As a result, landing accuracy of an ink droplet might deteriorate due to the meniscus shape. In view of this, it is possible to exhibit the above effects by including the preliminary oscillatory waveform part and the main oscillatory waveform part in voltage waveform of voltage to be applied to an ink jet head with respect to which the preliminary drive operation is performed.

Also, according to another further preferable aspect of the ink jet device relating to the aspect of the present invention, a droplet of ink to be ejected from the at least one ink jet head may differ in terms of physical properties from a droplet of ink to be ejected from a remainder of the plurality of ink jet heads.

The ink housing unit houses therein various types of inks that differ from each other in terms of color phase, chroma, lightness, and so on. The ink jet device includes the plurality of ink jet heads corresponding to such various types of inks. Accordingly, the various types of inks housed in the ink jet heads differ from each other in many ways in terms of physical properties such as boiling temperature, surface tension, and viscosity. The inks, which differ from each other in terms of physical properties, also differ from each other in terms of ejection behavior of an ink droplet. Accordingly, the inks, which differ from each other in terms of physical properties, also differ from each other in terms of degree and frequency of a failure that occurs during ink droplet ejection. The failure is for example ejection of an ink droplet having smaller volume than the defined droplet, ejection of an ink droplet in various directions, and so on.

In view of this, according to the other further preferable aspect of the present invention, the preliminary drive operation is performed which is independent from the main drive operation for ejecting an ink droplet, with respect to the ink jet head that houses therein ink having physical properties that deteriorate landing accuracy of an ink droplet due to ejection of an ink droplet having volume smaller than the defined volume. As a result, the other further preferable aspect of the present invention is effective in ejecting droplets of various types of inks which differ from each other in many ways in terms of physical properties for preventing a problem, such as ejection of an ink droplet having smaller volume than the defined droplet and ejection of an ink droplet in various directions, from occurring during ink droplet ejection. Also, even in the case where an ink droplet is ejected by application of drive voltage of high frequency, landing accuracy of the ink droplet can be improved.

More detailed description is given as follows. In the case where inks differ from each other in terms of physical properties, the inks also differ from each other in terms of meniscus shape of an ink surface. Accordingly, the inks, which differ from each other in terms of physical properties, also differ from each other in terms of degree and frequency of a failure that occurs during ink droplet ejection. The failure is for example ejection of an ink droplet having smaller volume than the defined droplet, ejection of an ink droplet in various directions, and so on. In view of this, by selecting at least one ink jet head with respect to which the preliminary drive operation is performed in accordance with physical properties of ink housed in the at least one ink jet head, it is possible to effectively suppress the failure caused by the meniscus shape of the ink surface. Also, even in the case where an ink droplet is ejected by application of drive voltage of high frequency, landing accuracy of the ink droplet can be improved.

Also, according to a yet another further preferable aspect of the ink jet device relating to the aspect of the present invention, the droplet of the ink to be ejected from the at least one ink jet head may be lower in terms of viscosity than the droplet of the ink to be ejected from the remainder of the plurality of ink jet heads.

Decrease in viscosity causes decrease in both displacement amount of drive voltage necessary for ejecting an ink droplet and volume of the ink droplet to be ejected. Accordingly, it is considered that when a subsequent ink droplet comes into contact with ink adhering near the nozzle, a flight course of the subsequent ink droplet is in particular easily deflected due to surface tension of the adhering ink.

According to the yet another further preferable aspect of the present invention, inks that differ from each other in terms of viscosity are housed in the separate ink jet heads, and the preliminary drive operation is performed with respect to the ink jet head in which the ink having a comparatively low viscosity is housed. As a result, it is possible to give sufficient motion energy to an ink droplet by controlling volume of the ink droplet to the extent that surface tension of ink adhering near the nozzle can be ignored. This effectively prevents deflection of a flight course of the ink droplet. Also, even in the case where an ink droplet is ejected by application of drive voltage of high frequency, landing accuracy of the ink droplet can be improved.

Also, according to a still another further preferable aspect of the ink jet device relating to the aspect of the present invention, the physical properties may include occurrence of a linear trail extending backward from part of the droplet of the ink in an ejection direction, and the droplet of the ink to be ejected from the at least one ink jet head may be longer in terms of trail than the droplet of the ink to be ejected from the remainder of the plurality of ink jet heads.

There is a case where a so-called trail linearly extends backward from part of an ink droplet, depending on surface tension, viscosity, and so on of the ink droplet. It is considered that increase in trail length increases a contact period of a subsequent ink droplet with ink adhering near the nozzle, and as a result a flight course of the subsequent ink droplet is easily deflected.

According to the still another further preferable aspect of the present invention, inks that differ from each other in terms of trail length are housed in the separate ink jet heads, and the preliminary drive operation is performed with respect to the ink jet head in which the ink having a comparatively long trail is housed. As a result, it is possible to give sufficient motion energy to an ink droplet by controlling volume of the ink droplet to the extent that surface tension of ink adhering near the nozzle can be ignored. This effectively prevents deflection of a flight course of the ink droplet. Also, even in the case where an ink droplet is ejected by application of drive voltage of high frequency, landing accuracy of the ink droplet can be improved.

Also, according to another further preferable aspect of the ink jet device relating to the aspect of the present invention, the pressure application unit included in each of the plurality of ink jet heads may have the piezoelectric element, and the at least one ink jet head may differ from the remainder of the plurality of ink jet heads in terms of frequency of voltage to be applied to the piezoelectric element.

When frequency of drive voltage (hereinafter, referred to also as drive frequency) to be applied to the piezoelectric element increases, an interval of ink droplet ejection per time decreases. This makes ink to easily adhere near the nozzle and increases the number of times a subsequent ink droplet comes into contact with the ink adhering near the nozzle. As a result, degree and frequency of a failure are increased such as deflection of a flight direction of the subsequent ink droplet.

In view of this, according to the other further preferable aspect, the at least one ink jet head differs from the remainder of the plurality of ink jet heads in terms of frequency of voltage to be applied to the piezoelectric element. This prevents deflection of a flight course of an ink droplet, thereby improving landing accuracy of the ink droplet. Also, even in the case where an ink droplet is ejected by application of drive voltage of high frequency, landing accuracy of the ink droplet can be improved.

Also, according to a yet another further preferable aspect of the ink jet device relating to the aspect of the present invention, the voltage to be applied to the piezoelectric element of the at least one ink jet head may have frequency of 10 kHz or higher.

As described above, the increase in frequency of drive voltage to be applied to the piezoelectric element increases degree and frequency of a failure that a flight direction of an ejected ink droplet is deflected. Particularly when drive frequency is set to a high frequency domain of 10 kHz or higher, landing accuracy of an ink droplet excessively deteriorates due to deflection of a flight course of the ink droplet.

In view of this, according to the yet another further preferable aspect, the voltage to be applied to the piezoelectric element of the at least one ink jet head has frequency of 10 kHz or higher. This prevents deflection of a flight course of an ink droplet to improve landing accuracy of the ink droplet. Also, even in the case where an ink droplet is ejected by application of drive voltage of high frequency, landing accuracy of the ink droplet can be improved.

Since there is a demand for increase in drive frequency at present, the upper limit of the drive frequency is not particularly limited. Setting of the upper limit to 20 kHz for example meets the present demand for increase in drive frequency.

Also, according to a yet another further preferable aspect of the ink jet device relating to the aspect of the present invention, a proportion of a displacement amount X of voltage to be applied for performing the preliminary drive operation to a displacement amount Y of voltage to be applied for performing the main drive operation may be set so as to satisfy $30 \leq X/Y \leq 50\%$.

It is preferable to set the proportion in displacement amount X/Y as high as possible, where X indicates the displacement amount of the voltage corresponding to the preliminary oscillatory waveform part for performing the preliminary drive operation, and Y indicates the displacement amount of the voltage corresponding to the main oscillatory waveform part for performing the main drive operation. This is because the higher the proportion in displacement amount X/Y is, the more ink housed in the ink housing unit is pushed toward the outer edge of the nozzle. In the case where the proportion in displacement amount X/Y is lower than 30%, even though ink is pushed toward the outer edge of the nozzle in the preliminary drive operation, the effects of improvement in landing accuracy of an ink droplet are not remarkably exhibited.

On the other hand, the upper limit of the proportion in displacement amount X/Y should preferably be set as high as possible to the extent that ink is not ejected. Setting of the upper limit to 50% sufficiently secures volume of an ink droplet to be ejected in the main drive operation, and the effects of the preliminary drive operation are sufficiently exhibited. According to the yet another further preferable aspect of the present invention, the displacement amount X of the voltage to be applied for performing the preliminary drive operation is set such that $30 \leq X/Y \leq 50\%$ is satisfied. This prevents deflection of a flight course of an ink droplet to improve landing accuracy of the ink droplet. Also, even in the case where an ink droplet is ejected by application of drive voltage of high frequency, landing accuracy of the ink droplet can be improved.

More detailed description is given as follows. The displacement amount X of the drive voltage, which is to be applied to the piezoelectric element for pushing the ink in the preliminary drive operation, should be preferably set as high as possible. This is because the higher the displacement amount X is, the more the meniscus shape of the ink surface is flattened. In the case where the meniscus shape is not sufficiently flattened, oscillation remaining on the ink surface due to the preliminary drive operation has considerably high amplitude, and as might resonate with oscillation occurring due to the main drive operation. Such a resonation causes ejection of another ink droplet having volume smaller than the defined volume. As a result, it is impossible to sufficiently exhibit the effects obtained by performing the preliminary drive operation. The resonation occurs depending on correlation between magnitude of the amplitude of the oscillation occurring due to the main drive operation and magnitude of the amplitude of the oscillation remaining on the ink surface due to the preliminary drive operation. For this reason, the proportion in displacement amount X/Y of drive voltage should be preferably set to equal to or higher than 30%.

Also, the upper limit of the proportion in displacement amount X/Y should preferably be set as high as possible to the extent that ink is not ejected. Setting of the upper limit to 50% sufficiently secures volume of an ink droplet to be ejected in the main drive operation, and the effects of the preliminary drive operation are sufficiently exhibited. In view of this, according to the further preferable aspect of the present invention in consideration of the meniscus shape of the ink surface, the displacement amount X of the voltage to be applied for performing the preliminary drive operation is set such that $30 \leq X/Y \leq 50\%$ is satisfied. This prevents deflection of a flight course of an ink droplet to improve landing accuracy of the ink droplet. Also, even in the case where an ink droplet is ejected by application of drive voltage of high frequency, landing accuracy of the ink droplet can be improved.

Also, according to a still another further preferable aspect of the ink jet device relating to the aspect of the present invention, the voltage waveform of the voltage to be applied to the piezoelectric element of the at least one ink jet head may further include an oscillation suppression waveform part for performing an oscillation suppression operation of suppressing oscillation occurring on a surface of the ink due to the main drive operation, and with respect to the at least one ink jet head, the ejection control unit may perform the oscillation suppression operation according to the oscillation suppression waveform part.

After an ink droplet is ejected in the main drive operation, oscillation remains on the ink surface due to the main drive operation. Accordingly, there is a case where the oscillation remaining due to the main drive operation causes an unexpected ink droplet to separate from the ink surface and adhere near the nozzle.

In view of this, according to the still another further preferable aspect of the present invention, with respect to the nozzle with respect to which the preliminary drive operation is performed, the oscillation suppression operation for suppressing oscillation occurring on the ink surface is performed after the main drive operation is performed. Accordingly, the voltage waveform of drive voltage to be applied includes the oscillation suppression waveform part subsequent to the main oscillatory waveform part. By including the oscillation suppression waveform part in the voltage waveform, it is possible to suppress oscillation remaining on the ink surface due to the main drive operation, thereby preventing ink from adhering near the nozzle. As a result, the effects of the preliminary drive operation are further increased. This prevents deflection of a flight course of an ink droplet to improve landing accuracy of the ink droplet. Also, even in the case where an ink droplet is ejected by application of drive voltage of high frequency, landing accuracy of the ink droplet can be improved.

More detailed description is given as follows. After an ink droplet is ejected in the main drive operation, oscillation remains on the ink surface due to the main drive operation. Since the ink surface is restored to the meniscus shape after the ink droplet is ejected, amplitude of the remaining oscillation is the highest around the vertex position of the meniscus shape. Accordingly, there is a case where the oscillation remaining due to the main drive operation causes an unexpected ink droplet to separate from the ink surface and adhere near the nozzle. It is possible to expect the above effects by further including the oscillation suppression waveform part subsequent to the main oscillatory waveform part in voltage waveform of drive voltage of the ink jet head with respect to which the preliminary drive operation is performed.

Also, according to another further preferable aspect of the ink jet device relating to the aspect of the present invention, the ink surface at a start time of the main drive operation after performance of the preliminary drive operation may be positioned more downward than the ink surface at a start time of the main drive operation without performance of the preliminary drive operation.

There is a case where oscillation, which remains on the ink surface due to the preliminary drive operation for pushing the ink, has considerably high amplitude toward the inside of the ink housing unit. In the case where the main drive operation is started at a position where the amplitude toward the inside of the ink housing unit is the highest for example, the effects can be suppressed that are obtained by pushing the ink toward the nozzle in the preliminary drive operation. Also, the remaining oscillation resonates with oscillation occurring due to the main drive operation, an ink droplet having volume smaller than the defined volume might be ejected. In view of this, according to the other further preferable aspect of the present invention, a surface of the ink at a start time of the main drive operation after performance of the preliminary drive operation is adjusted so as to be positioned more downward than the surface of the ink at a start time of the main drive operation without performance of the preliminary drive operation. As a result, even when the oscillation remaining on the ink surface due to the preliminary drive operation has high amplitude, it is possible to prevent deflection of a flight course of an ink droplet, thereby improving landing accuracy of the ink droplet. Also, even in the case where an ink droplet is ejected by application of drive voltage of high frequency, landing accuracy of the ink droplet can be improved.

More detailed description is given as follows. Oscillation remains on the ink surface due to pushing of ink in the preliminary drive operation. Amplitude of the remaining oscillation is suppressed by flattening the meniscus shape in the preliminary drive operation.

However, in the case where the main drive operation is started while the vertex of the ink surface that oscillates in accordance with the remaining oscillation is positioned more inward in the ink housing unit than the vertex of the ink surface with no preliminary drive operation, the remaining oscillation might resonate with oscillation occurring due to the main drive operation. Particularly in the case where the main drive operation is started while the amplitude toward the inside of the ink housing unit has the maximum magnitude, the remaining oscillation resonates with the oscillation occurring due to the main drive operation to a great extent. Since this resonation might cause ejection of an ink droplet having volume smaller than the defined droplet, the effects obtained by performing the preliminary drive operation cannot be sufficiently exhibited.

In view of this, a surface of the ink at a start time of the main drive operation after performance of the preliminary drive operation is adjusted so as to be positioned more downward than the surface of the ink at a start time of the main drive operation without performance of the preliminary drive operation. As a result, it is possible to suppress resonation of the oscillation remaining due to the preliminary drive operation with the oscillation occurring due to the main drive operation, and this prevents deflection of a flight course of an ink droplet to improve landing accuracy of the ink droplet. Also, even in the case where an ink droplet is ejected by application of drive voltage of high frequency, landing accuracy of the ink droplet can be improved.

In the further preferable aspect of the present invention in consideration of the meniscus shape of the ink surface, the preliminary drive operation should be desirably started while the vertex of the meniscus shape of the ink surface is positioned closer to the outer edge of the nozzle than the vertex of the meniscus shape of the ink surface in static state.

After an ink droplet is ejected in the main drive operation, the ink surface is restored to the meniscus shape. However, it is considered that the ink surface is not in static state, and oscillation remains on the ink surface due to the main drive operation. In the case where the remaining oscillation resonates with the oscillation occurring due to the preliminary drive operation, the amplitude is the highest around the vertex of the meniscus shape. Particularly in the case where the preliminary drive operation is performed while the amplitude of the remaining oscillation toward the inside of the ink housing unit is the maximum magnitude, the remaining oscillation resonates with the oscillation occurring due to the preliminary drive operation to a great extent. Since this resonation might cause ejection of an ink droplet during the preliminary drive operation, the effects obtained by performing the preliminary drive operation cannot be sufficiently exhibited.

In view of this, the preliminary drive operation is started while the vertex of the meniscus shape of the ink surface is positioned closer to the outer edge of the nozzle than the vertex of the meniscus shape of the ink surface in static state. As a result, it is possible to suppress resonation of the oscillation remaining on the ink surface due to the main drive operation with the oscillation occurring due to the preliminary drive operation, thereby preventing deflection of a flight course of an ink droplet. This improves landing accuracy of the ink droplet. Also, even in the case where an ink droplet is ejected by application of drive voltage of high frequency, landing accuracy of the ink droplet can be improved.

Another aspect of the present invention provides a method of manufacturing an organic EL device comprising: forming a first electrode on a substrate; forming one or more functional layers including a light-emitting layer on the first electrode; forming a second electrode on the functional layers, wherein in the forming the functional layers, the functional layers are formed by applying ink including material of the functional layer and solvent with use of the ink jet device of any of the above aspects of the present invention, and at least evaporating and drying the solvent.

In recent years, organic EL display panels as organic EL devices attract attention because being utilizable as displays and surface light sources for lighting. An organic EL display panel has the device configuration in which a plurality of organic EL elements are arranged on a substrate in matrix. The organic EL elements are each a current driven element having the device configuration in which anodes, one or more functional layers including a light-emitting layer, and a cathode are layered on a substrate in this order. The functional layers include, in addition to the light-emitting layer, a hole transport layer for improving light-emitting efficiency and so on. The functional layers are formed mainly by a vapor deposition method or the ink jet method as an application method. The ink jet method attracts attention because of having a cost advantage that material is not wasted compared with the vapor deposition method. In the forming the functional layers, the light-emitting layer is formed by the inkjet method as follows for example. Ink containing organic material of light-emitting layer is applied by the inkjet method to a plurality of pixels that are partitioned by a barrier rib formed on the substrate. Then, solvent contained in the ink is removed by drying and so on.

According to an ink jet technique for layer formation with use of a conventional ink jet device, inequality exists in shape of the functional layers depending on type of used ink and repetition frequency of ink droplet ejection. This is caused by deflected landing of an ink droplet from a subpixel area of an organic EL element constituting a display panel, or deflected landing of an ink droplet that results in ununiform film thickness. As a result, electric current does not uniformly flow to the pixels, or electric current collectively flows to a part of a pixel having thin film thickness. This causes inequality or deterioration in light-emitting characteristics and light-emitting lifetime, and as a result the manufacturing yield decreases. In view of the present situation where a demand arises for short-time ink droplet ejection to a large-size substrate with further precision, urgent solution of this technical problem of decrease in the manufacturing yield is desired.

In view of this, according to the manufacturing method relating to the other aspect of the present invention, the functional layers are formed by applying ink including material of the functional layer and solvent with use of the ink jet device relating to any of the above aspects of the present invention, and at least evaporating and drying the solvent. As a result, it is possible to improve landing accuracy of an ink droplet irrespective of type of used ink and repetition frequency of ink droplet ejection, thereby suppressing inequality in products and improving the manufacturing yield.

Embodiment 1

The following describes an ink jet device relating to the present embodiment with reference to the drawings.

<Ink Jet Device 1000>

Figure 2:
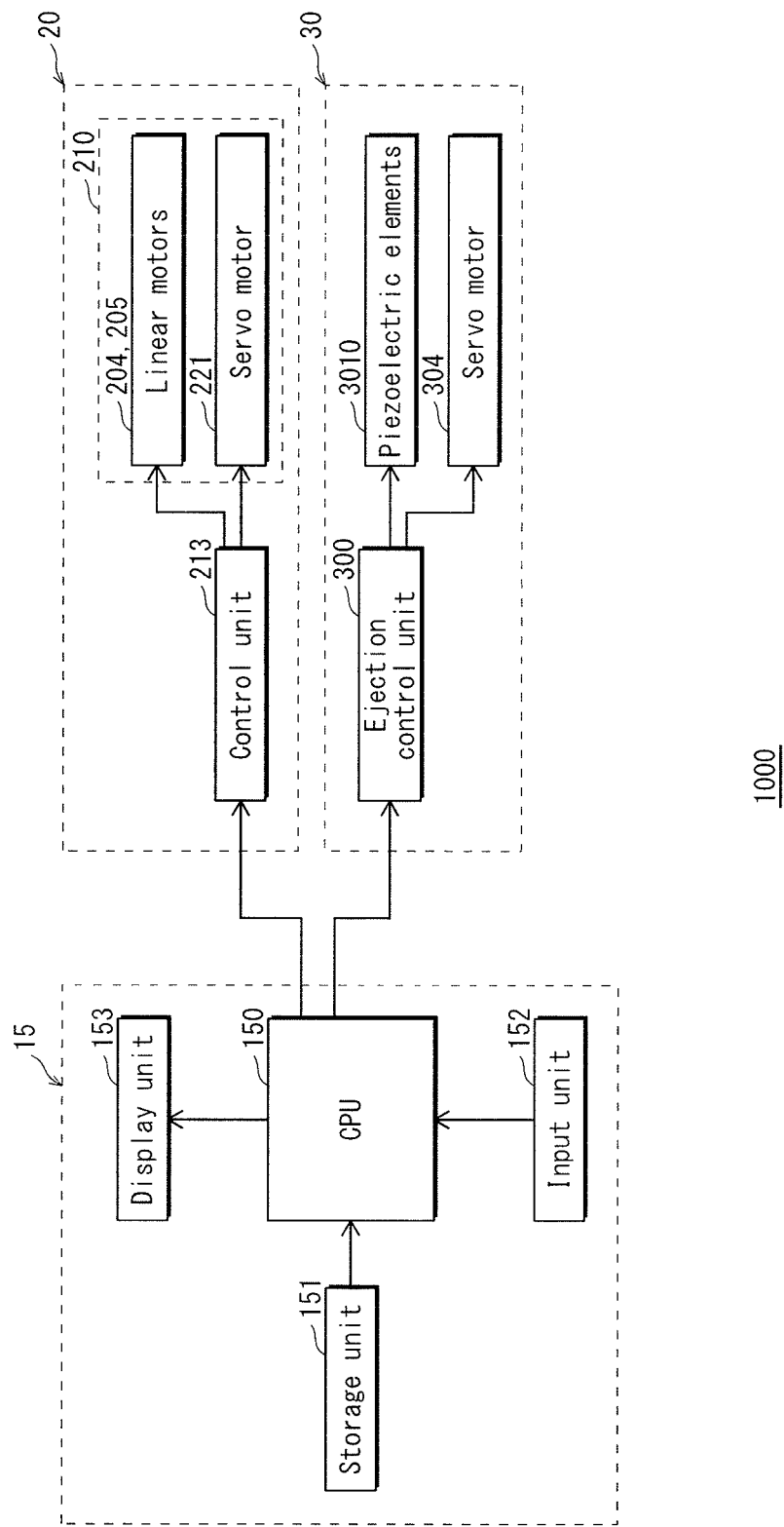
FIG. 2 is a functional block diagram showing the ink jet device 1000.

FIG. 1 shows the primary configuration of an ink jet device 1000 relating to the present embodiment. FIG. 2 is a functional block diagram showing the ink jet device 1000.

As shown in FIG. 1 and FIG. 2, the ink jet device 1000 includes an ink jet table 20, a head unit 30, and a control device 15.

As shown in FIG. 2, the control device 15 includes a CPU 150, a storage unit 151 (including a large-capacity storage unit such as an HDD), a display unit (display) 153, and an input unit 152. One specific example of the control device 15 is a personal computer (PC). The storage unit 151 stores therein control programs and so on for driving the ink jet table 20 and the head unit 30 which are connected to the control device 15. When the ink jet device 1000 is driven, the CPU 150 performs predetermined control based on an instruction input by an operator via the input unit 152 and the control programs stored in the storage unit 151.

Although the ink jet device 1000 is illustrated in a simplified manner as including the single head unit 30 having a single ink jet head 301 for convenience of description, the ink jet device 1000 actually includes a plurality of ink jet heads 301. The configuration of the ink jet heads 301 is not particularly limited. For example, a single head unit 30 may include the ink jet heads 301, or a plurality of head units 30 each may include at least one ink jet head 301.

<Ink Jet Table 20>

As shown in FIG. 1, the ink jet table 20 is a so-called gantry work table where a gantry unit (movable frame) is movably disposed along a pair of guiding shafts on a base.

A specific configuration of the ink jet table 20 is as follows. Columnar stands 201A, 201B, 202A and 202B are arranged at the four corners of an upper surface of a plate-like base 200. A fixed stage ST and an ink pan (dish-like container) IP are disposed in an inner region surrounded by the stands 201A, 201B, 202A and 202B. An application target substrate is placed on the fixed stage ST. Immediately before ink is applied to the application target substrate, the ink is ejected into the ink pan IP to stabilize ejection properties.

Furthermore, guiding shafts 203A and 203B are supported by the stands 201A and 201B and the stands 202A and 202B, respectively in such a manner that the guiding shafts 203A and 203B extend in the longitudinal direction of the base 200 (the Y direction) in parallel with each other. The guiding shafts 203A and 203B are inserted through linear motor units 204 and 205, respectively. A gantry unit 210 is mounted on the linear motor units 204 and 205 so as to suspend the guiding shafts 203A and 203B over the linear motor units 204 and 205, respectively. With this configuration, when the ink jet device 1000 is driven, the gantry unit 210 slides back and forth in the longitudinal direction of the guiding shafts 203A and 203B (the Y-axis direction) due to driving of the pair of linear motor units 204 and 205.

The gantry unit 210 is provided with a movable member (carriage) 220 that is composed of an L-shaped mount. The movable member 220 is provided with a servo motor unit (movable motor) 221. Gears which are not illustrated are attached to the tip of the shaft of the servo motor unit 221. The gears fit into a guiding groove 211 extending in the longitudinal direction of the gantry unit 210 (the X direction). A minute rack extending in the longitudinal direction of the gantry unit 210 is disposed inside the guiding groove 211. The gears are engaged with the rack. Accordingly, when the servo motor unit 221 is driven, the movable member 220 moves back and forth with precision in the X-axis direction by a so-called rack and pinion mechanism.

The movable member 220 is provided with the head unit 30. Accordingly, it is possible to control the head unit 30 to scan the application target substrate by moving the gantry unit 210 in the longitudinal direction of the guiding shafts 203A and 203B while the movable member 220 is fixed to the gantry unit 210, or by moving the movable member 220 in the longitudinal direction of the gantry unit 210 while the gantry unit 210 is suspended. The main scanning direction and the sub scanning direction of the head unit 30 are the column (the Y-axis) direction and the row (the X-axis) direction, respectively.

The linear motor units 204 and 205 and the servo motor unit 221 are each connected to the control unit 213 such that the control unit 213 directly controls driving of the linear motor units 204 and 205 and the servo motor unit 221. The control unit 213 is connected to the CPU 150 included in the control device 15. When the ink jet device 1000 is driven, the linear motor units 204 and 205 and the servo motor unit 221 are controlled to drive by the CPU 150, which has read the control programs, via the control unit 213 (see FIG. 2).

<Ink Jet Head 301>

The head unit 30 employs a piezoelectric system, and includes the ink jet head 301 and a body 302. The inkjet head 30 is fixed to the movable member 220 via the body 302. The body 302 has built therein a servo motor unit 304 (see FIG. 2). Rotation of the servo motor unit 304 adjusts an angle between the longitudinal direction of the ink jet head 301 and the X-axis of the fixed stage ST.

Figure 3A:
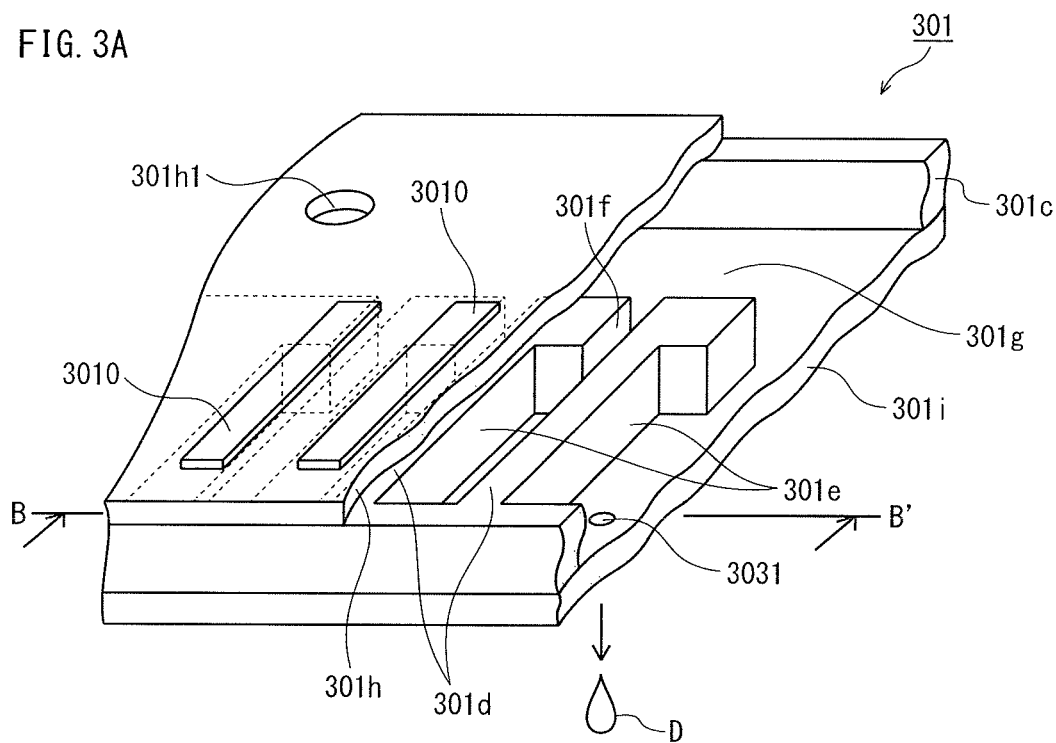
FIG. 3A is a partially cutaway perspective cross-sectional view schematically showing the outline configuration of an ink jet head 301 of the ink jet device 1000.
Figure 3B:
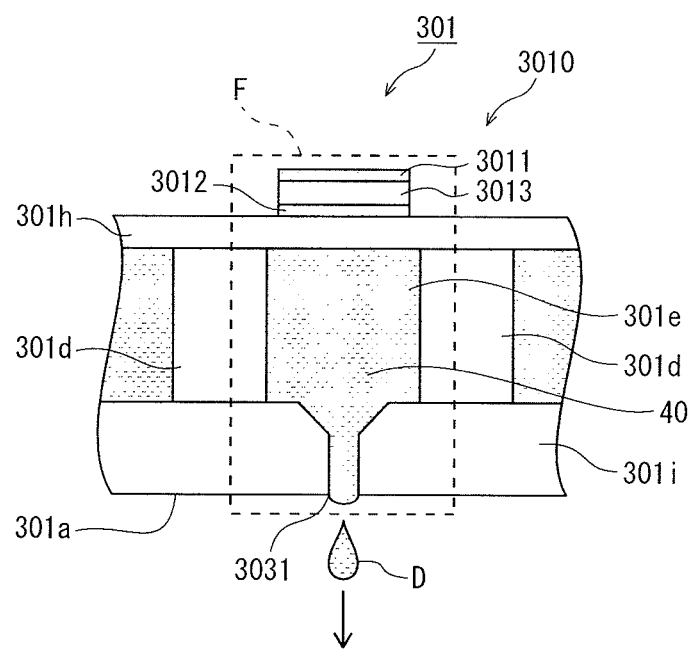
FIG. 3B is a partially enlarged cross-sectional view schematically showing the ink jet head 301.

FIG. 3A is a partially cutaway perspective cross-sectional view showing the outline configuration of the ink jet head 301. FIG. 3B is a partially enlarged cross-sectional view showing the ink jet head 301 taken along a line B-B' in FIG. 3A. As shown in FIG. 3A and FIG. 3B, the ink jet head 301 includes a nozzle plate 301i, a housing plate 301c, and an oscillation plate 301h that are overlaid in this order. The nozzle plate 301i has a plurality of nozzles 3031 through which droplets D are ejected. The housing plate 301c has barrier ribs 301d that section ink housing units 301e that are communicated with the respective nozzles 3031. The oscillation plate 301h has joined thereto piezoelectric elements 3010 that are pressure application units serving as driving means corresponding to the respective ink housing units 301e.

The housing plate 301c has, in addition to the barrier ribs 301d which section the section ink housing units 301e communicated with the respective nozzles 3031, passages 301f and 301g through which ink is filled in the ink housing units 301e. The passages 301f and 301g are each a space resulting from sandwiching the housing plate 301c, which includes the barrier ribs 301d, between the nozzle plate 301i and the oscillation plate 301h. The passage 301g serves as a reservoir in which ink is stored.

Ink is supplied from an ink tank or the like through a pipe, and is stored in the reservoir through a supply hole 301h1 provided in the oscillation plate 301h. Then, the ink is stored in the ink housing units 301e through the passage 301f.

As shown in FIG. 3B, the piezoelectric elements (the pressure application units) 3010 are each composed of a pair of electrodes 3011 and 3012 that sandwich an element body 3013 therebetween. When drive voltage is externally applied to the pair of electrodes 3011 and 3012, the oscillation plate 301h to which the piezoelectric elements 3010 are joined is deformed. This decreases volume of the ink housing units 301e, which are partitioned by the barrier ribs 301d. As a result, ink 40 that is filled in the ink housing units 301e is increased in pressure, and liquid material is ejected as droplets D through the nozzles 3031. Then, when application of the drive voltage is stopped, the oscillation plate 301h is restored to the original shape, and the volume of the ink housing units 301e is restored. As a result, the ink is sucked from the reservoir to the ink housing units 301e. It is possible to control amount, ejection timing, and so on of the ink to be ejected through the nozzles 3031, by controlling the drive voltage to be applied to the piezoelectric elements 3010.

Note that a region F surrounded by a dashed line in FIG. 3B indicates a cross-section of a region of the ink jet head 301 corresponding to each of the nozzles 3031. The region F is constituted from the ink housing unit 301e, the barrier ribs 301d constituting the ink housing unit 301e, the oscillation plate 301h, the nozzle plate 301i, the piezoelectric element 3010, and the nozzle 3031. In the present embodiment, the number of the nozzles 3031 included in the ink jet heads 301 is plural. However, the present invention is not limited to this configuration at all. Alternatively, the ink jet head 301 may for example have one nozzle 3031 corresponding to only the region F.

The ink jet head 301 has the nozzles 3031 on a surface thereof facing the fixed stage ST. The nozzles 3031 are arranged for example in rows in the longitudinal direction of the ink jet head 301. Ink (liquid material) which is supplied to the ink jet head 301 is ejected through the nozzles 3031 as droplets to the application target substrate.

The ink jet device 1000 relating to the present embodiment includes the plurality of ink jet heads 301 each including the ink housing unit 301e that houses therein ink and the pressure application unit 3010 that applies pressure to the ink housed in the ink housing unit 301e. The ink jet heads 301 may be the same or different from each other in terms of type of housed ink, and this is not particularly limited. For example, the ink jet heads 301 included in the ink jet head units 30 may one-to-one correspond to different types of ink such that different types of droplets are ejected through the nozzles 3031 of the ink jet heads 301 to the application target substrate.

As described above, droplet ejection operations of the nozzles 3031 are controlled in accordance with the drive voltage to be applied to the piezoelectric elements 3010 included in the nozzles 3031. An ejection control unit 300 is connected with each of the ink jet heads 301. The ejection control unit 300 controls the drive voltage to be applied to the piezoelectric elements 3010, and as a result predetermined ink droplets are ejected through the nozzles 3031. Specifically as shown in FIG. 2, the CPU 150 reads the predetermined control programs from the storage unit 151, and instructs the ejection control unit 300 to apply defined voltage to the piezoelectric elements 3010. In accordance with this instruction, the ejection control unit 300 controls the drive voltage to be applied to the piezoelectric elements 3010.

In the present embodiment, the oscillation plate 301h of the ink housing unit 301e is deformed by the plate-like piezoelectric elements 3010 which are flexural oscillators. However, the configuration of the oscillators is not limited to this. Alternatively, longitudinal oscillators using rod piezoelectric elements may be for example employed. In this case, the oscillation plate 301h of the ink housing unit 301e is deformed in a deformation direction of rod piezoelectric elements.

<Drive Voltage>

(Waveform Configuration)

In the present embodiment, with respect to at least one of the ink jet heads 301, the preliminary drive operation is performed for pushing the ink 40 housed in the ink housing unit 301e toward the outer edge of the nozzle 3031 through pressure application by the pressure application unit 3010 to the extent that a droplet of the ink 40 is not ejected, and then the main drive operation is performed for ejecting the droplet of the ink 40. The following describes the waveform configuration of the respective drive voltages for performing the preliminary drive operation and the main drive operation, by comparison with the waveform configuration of conventional drive voltage for performing the main drive operation without performing the preliminary drive operation.

Figure 4A:
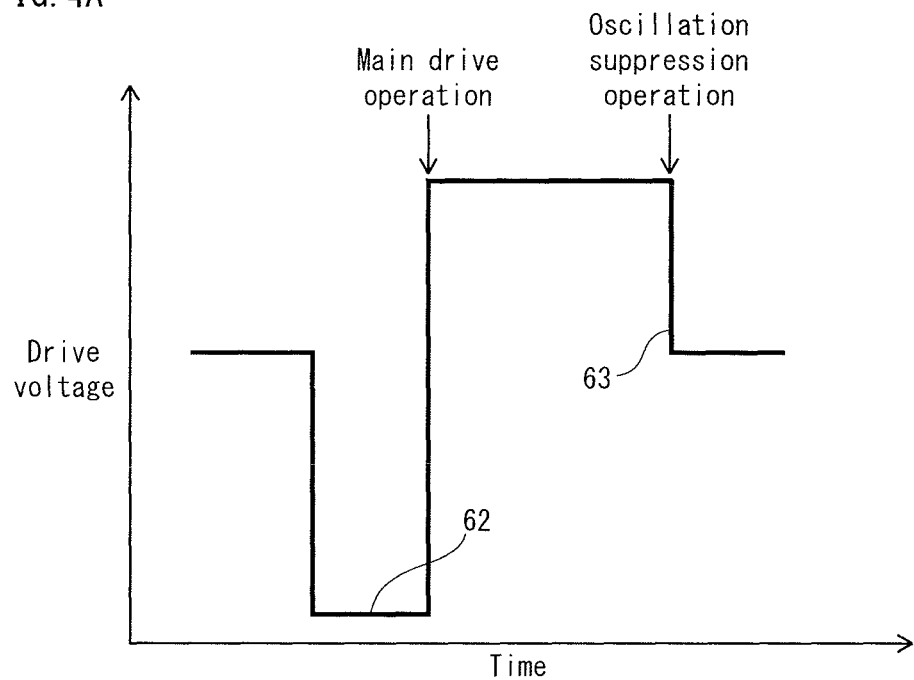
FIG. 4A illustratively shows the configuration of drive waveform of drive voltage in a conventional ink jet device, and FIG. 4B schematically shows, in sections (i) to (iii), ejection behavior of ink upon application of the drive voltage shown in FIG. 4A.
Figure 4B:
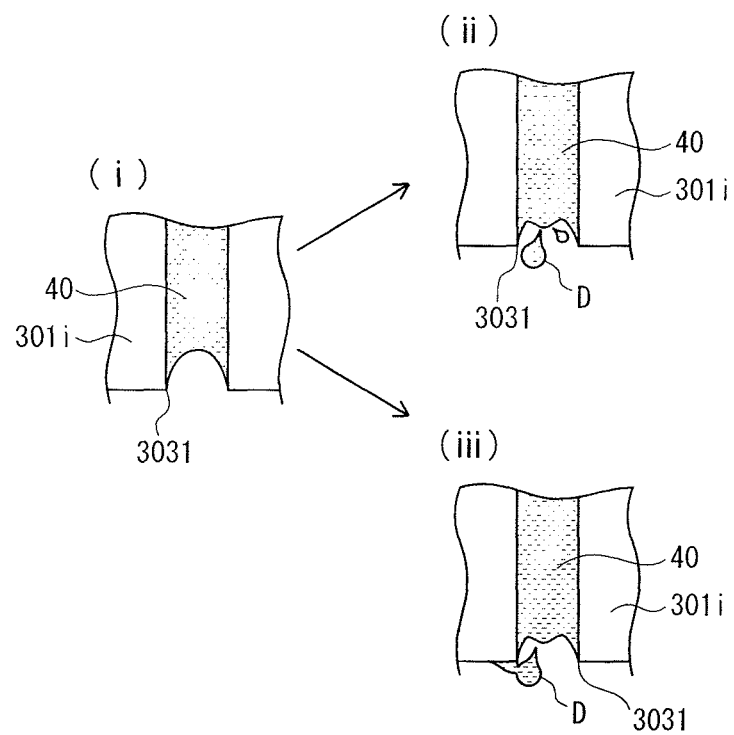
Figure 5A:
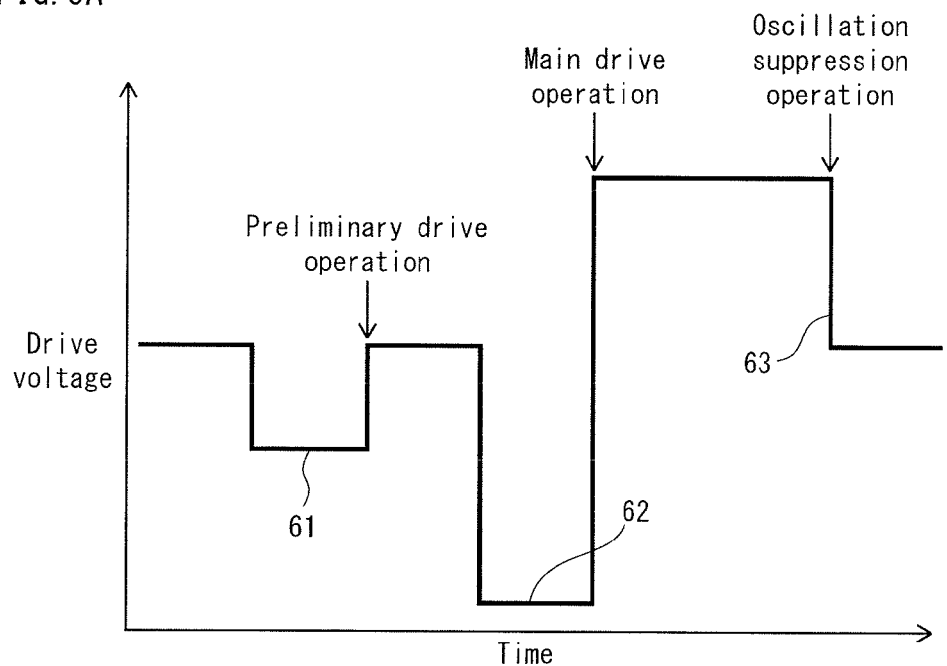
FIG. 5A illustratively shows the configuration of drive waveform of drive voltage in the ink jet device 1000, and FIG. 5B schematically shows, in sections (i) to (iii), ejection behavior of ink upon application of the drive voltage shown in FIG. 5A.
Figure 5B:
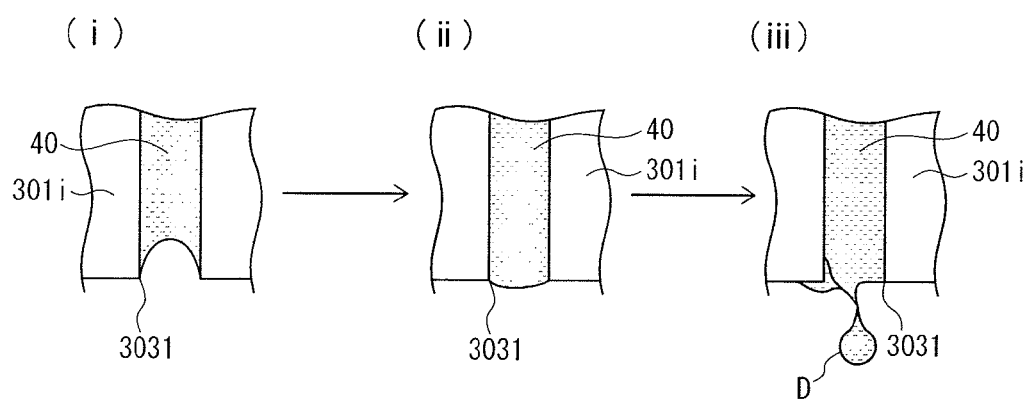

FIG. 4A illustratively shows the configuration of drive waveform of drive voltage in a conventional ink jet device, and FIG. 4B schematically shows ejection behavior of ink upon application of the drive voltage shown in FIG. 4A. FIG. 5A illustratively shows the configuration of drive waveform of drive voltage in the ink jet device 1000 relating to the present embodiment, and FIG. 5B schematically shows ejection behavior of ink upon application of the drive voltage shown in FIG. 5A. FIG. 4B and FIG. 5B each show only the vicinity of the nozzle 3031 extracted from FIG. 3B.

The drive waveform of the drive voltage shown in FIG. 4A includes a main oscillatory waveform part 62 and an oscillation suppression waveform part 63. The main oscillatory waveform part 62 is a waveform part for performing a main drive operation by a so-called pull ejection according to which ink droplet is ejected by first increasing the volume of the ink housing unit to expand the ink housing unit, and then decreasing the volume of the ink housing unit to shrink the ink housing unit. The oscillation suppression waveform part 63 is a waveform part for performing an oscillation suppression operation to suppress oscillation that remains on an ink surface due to the main drive operation. At an application start time of drive voltage corresponding to the main oscillatory waveform part 62, the ink 40 is located inside the ink housing units 301e while the ink surface is distant from the outer edge of the nozzle 3031 (section (i) in FIG. 4B). Accordingly, when the drive voltage corresponding to the main oscillatory waveform part 62 is applied, ununiform positive pressure is applied to the ink surface. This might result in that a droplet having a smaller volume than the defined volume is ejected, or that such a droplet is ejected in various directions (section (ii) in FIG. 4B). Furthermore, there is a case where a failure occurs that a subsequent ink droplet comes into contact with ink adhering near the nozzle 3031, and a flight course of the subsequent droplet is deflected due to surface tension (section (iii) in FIG. 4B).

More detailed description is given as follows. When the drive voltage corresponding to the main oscillatory waveform part 62 is applied, the ink surface at a time immediately before ejection has a meniscus shape that is curved toward inside the ink housing unit 301e as shown in section (i) in FIG. 4B. Accordingly, the positive pressure applied to the ink surface is ununiform, and amplitude is the highest around the vertex of the meniscus shape. As a result, a droplet D having a smaller volume than the defined volume is ejected, or the droplet D is ejected in the various directions (section (ii) in FIG. 4B). Furthermore, a subsequent ink droplet comes into contact with ink adhering near the nozzle 3031, and a flight course of the subsequent droplet is deflected due to surface tension (section (iii) in FIG. 4B).

The drive waveform of the drive voltage shown in FIG. 5A includes a preliminary oscillatory waveform part 61, a main oscillatory waveform part 62, and an oscillation suppression waveform part 63. The preliminary oscillatory waveform part 61 is a waveform part for performing a preliminary drive operation to push ink toward the outer edge of the nozzle 3031 by first increasing the volume of the ink housing unit 301e to expand the ink housing unit 301e, and then decreasing the volume of the ink housing unit 301e. The main oscillatory waveform part 62 and the oscillation suppression waveform part 63 are the same as those shown in FIG. 4A. In the preliminary drive operation, the ink 40 is pushed toward the outer edges of the nozzles 3031, and as a result the ink 40 is changed from the state shown in section (i) in FIG. 5B to the state shown in section (ii) in FIG. 5B. Accordingly, when drive voltage corresponding to the main oscillatory waveform part 62 is applied, positive pressure applied to the ink surface is uniform, and this allows ejection of a droplet of the ink 40 having the defined volume with high straightness. Also, as the volume of the droplet of the ink 40 to be ejected increases, motion energy of the droplet increases. Accordingly, even when a subsequent droplet comes into contact with ink adhering near the nozzle 3031, the subsequent droplet is less influenced by surface tension, and is ejected with high straightness. This prevents deflection of a flight course of the droplet (section (iii) in FIG. 5B).

More detailed description is given as follows. The preliminary oscillatory waveform part 61 is a waveform part for performing the preliminary drive operation to flatten the meniscus shape by pushing the ink. At a time immediately before the preliminary drive operation through application of the drive voltage corresponding to the preliminary oscillatory waveform part 61, the ink surface has a meniscus shape that is curved toward inside the ink housing unit 301e as shown in section (i) in FIG. 5B. However, the meniscus shape of the ink surface is flattened through the preliminary drive operation (section (ii) in FIG. 5B). When the drive voltage corresponding to the main oscillatory waveform part 62 is applied, the ink surface at a time immediately before ejection has the meniscus shape that is flattened as described above. Accordingly, the positive pressure applied to the ink surface is uniform, and the amplitude around the vertex of the meniscus shape is smaller than in the case where the meniscus shape is not flattened. This allows ejection of the ink droplet having the defined volume with high straightness. Furthermore, even when a subsequent droplet comes into contact with ink adhering near the nozzle 3031, the subsequent droplet is less influenced by surface tension, and is ejected with high straightness. This prevents deflection of a flight course of the droplet (section (iii) in FIG. 5B).

In the present embodiment, in order to drive at least one of the ink jet heads 301 with which the preliminary drive operation is performed, the drive voltage corresponding to the drive waveform shown in FIG. 5A is applied. The drive waveform includes the preliminary oscillatory waveform part, the main oscillatory waveform part, and the oscillation suppression waveform part. Since the drive voltage corresponding to the preliminary oscillatory waveform part, which is independent from the drive voltage corresponding to the main oscillatory waveform part, is applied prior to the drive voltage corresponding to the main oscillatory waveform part, it is possible to improve landing accuracy of an ink droplet to be ejected.

In order to drive a remainder of the ink jet heads 301 with respect to which the preliminary drive operation is not performed, the drive voltage having the waveform configuration including the main oscillatory waveform part and the oscillation suppression waveform part such as exemplified in FIG. 4A is applied. Note that the preliminary drive operation is performed with respect to the ink jet head 301 through which an ink droplet having the defined volume is not ejected and shows lower landing accuracy of the ink droplet. More specifically, the ink jet head 301 to be targeted is determined for example in consideration of physical properties of ink housed in the ink jet head 301 or drive frequency as described later in <Experiment and Analysis>.

Also, in the present embodiment, the drive voltage corresponding to the main oscillatory waveform part is applied for performing the main drive operation by the pull ejection method. Alternatively, the main drive operation may be performed by the push ejection method for shrinking the ink housing unit 301e without being expanded once, and the drive voltage corresponding to the main oscillatory waveform part may be applied as such. In this case, drive waveform of the drive voltage is as exemplified in FIG. 6A. Also, in the present embodiment, the drive waveform of the drive voltage includes the oscillation suppression waveform part. However, this is not an essential element, and the drive waveform of the drive voltage may include only the preliminary oscillatory waveform part and the main oscillatory waveform part such as exemplified in FIG. 6B. Furthermore, in the present embodiment, the drive voltage corresponding to the preliminary oscillatory waveform part is applied for performing the preliminary drive operation by the pull ejection method. Alternatively, the drive voltage corresponding to the preliminary oscillatory waveform part may be applied by the push ejection method for shrinking the ink housing unit 301e without being expanded once. In this case, drive waveform of the drive voltage is as exemplified in FIG. 6C. As described above, the waveform configuration of the drive voltage is not limited to that shown in the present embodiment, and only needs to have the waveform configuration including the preliminary oscillatory waveform part for performing the preliminary drive operation to pushing ink toward the outer edge of the nozzle and the main oscillatory waveform part subsequent to the preliminary oscillatory waveform part for ejecting an ink droplet.

(Displacement Amount and Waveform Width of Drive Voltage)

Figure 7:
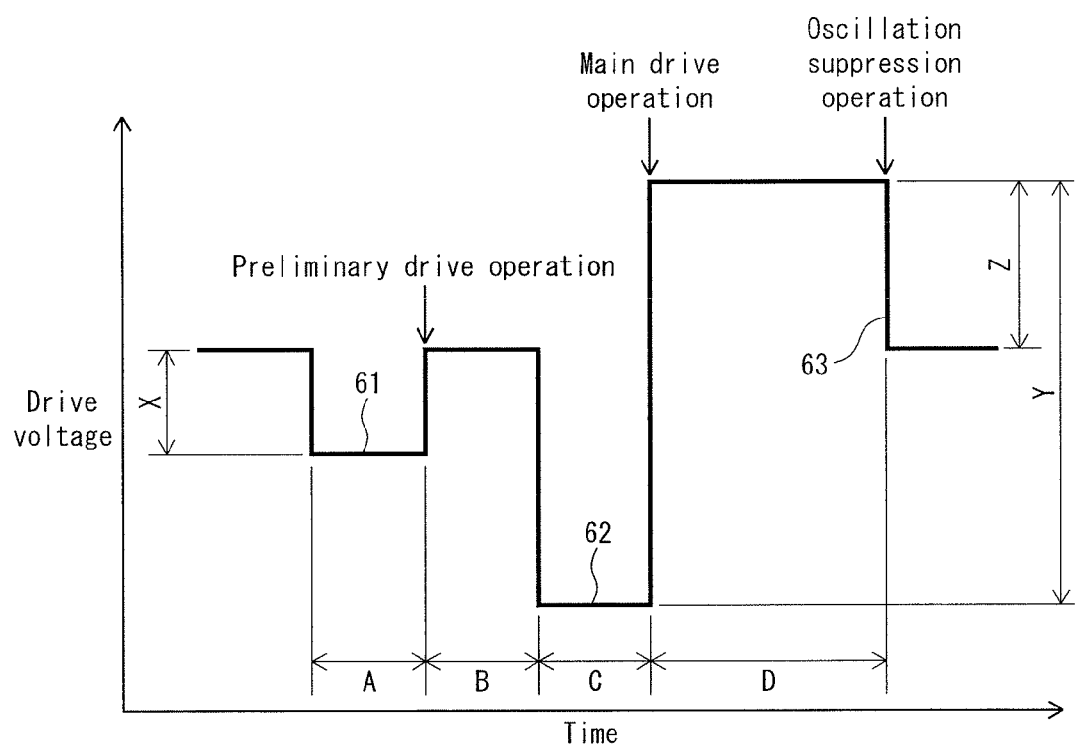
FIG. 7 shows waveform configuration and shape of drive voltage in the ink jet device 1000.

FIG. 7 shows drive waveform of drive voltage used in the present embodiment. In FIG. 7, the preliminary oscillatory waveform part 61, the main oscillatory waveform part 62, and the oscillation suppression waveform part 63 have waveform widths A, B, and C, respectively, and voltages applied for performing the preliminary drive operation, the main drive operation, and the oscillation suppression operation have displacement amounts X, Y, and Z, respectively.

The following describes the displacement amount and the drive waveform width with respect to each of the preliminary oscillatory waveform part, the main oscillatory waveform part, and the oscillation suppression waveform part.

<Preliminary Oscillatory Waveform Part>

Drive voltage corresponding to the preliminary oscillatory waveform part is applied for performing the preliminary drive operation. The lower limit of the displacement amount X of drive voltage corresponding to the preliminary oscillatory waveform part should be a value necessary for pushing ink to the extent that an ink droplet having the defined volume can be ejected in the main drive operation. The upper limit of the displacement amount X should be a value to the extent that an ink droplet is not ejected in the preliminary drive operation. Accordingly, in consideration of that the displacement amount Y of the drive voltage necessary for ejecting the ink droplet varies depending on physical properties of the ink, a preferable range of the displacement amount X of the drive voltage is set in relation to the displacement amount Y of the drive voltage such that $30\% \leq X/Y \leq 50\%$ is satisfied.

More specifically, the lower limit of the displacement amount X of the drive voltage should be a value that allows to flatten the meniscus shape of the ink surface to the extent that an ink droplet having the defined volume is ejected in the main drive operation. Accordingly, in consideration of that the displacement amount Y of the drive voltage necessary for ejecting the ink droplet varies depending on physical properties of the ink, a preferable range of the displacement amount X of the drive voltage is set in relation to the displacement amount Y of the drive voltage such that $30\% \leq X/Y$ is satisfied. The upper limit of the displacement amount X is set such that $30\% \leq X/Y \leq 50\%$ is satisfied.

The waveform width A of the preliminary oscillatory waveform part is set such that oscillation that remains on the ink surface due to the main drive operation or oscillation that occurs due to application of drive voltage corresponding to the preliminary oscillatory waveform part for expanding the ink housing unit does not resonate with oscillation that occurs due to application of drive voltage for shrinking the ink housing unit 301e in the preliminary drive operation. The waveform width A is for example set to T/2 that is half a period T of the helmholtz resonance frequency in the ink housing unit 301e.

Figure 6A:
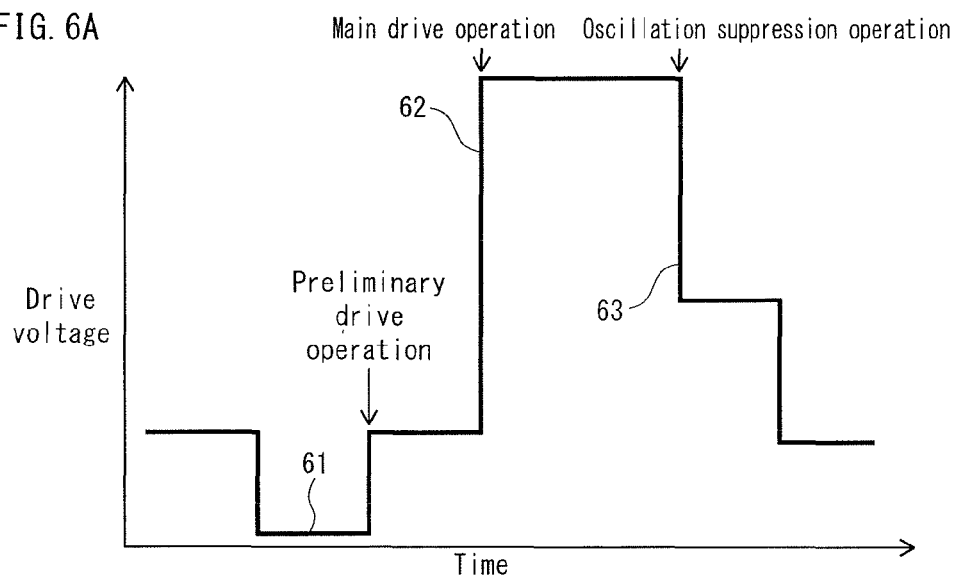
FIGS. 6A, 6B, and 6C show examples of drive waveform of drive voltage in the ink jet device 1000, where
Figure 6B:
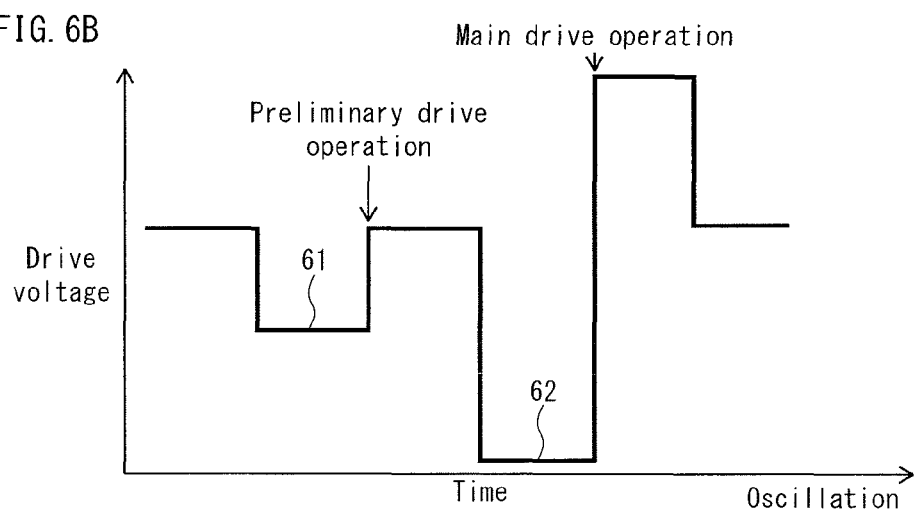
Figure 6C:
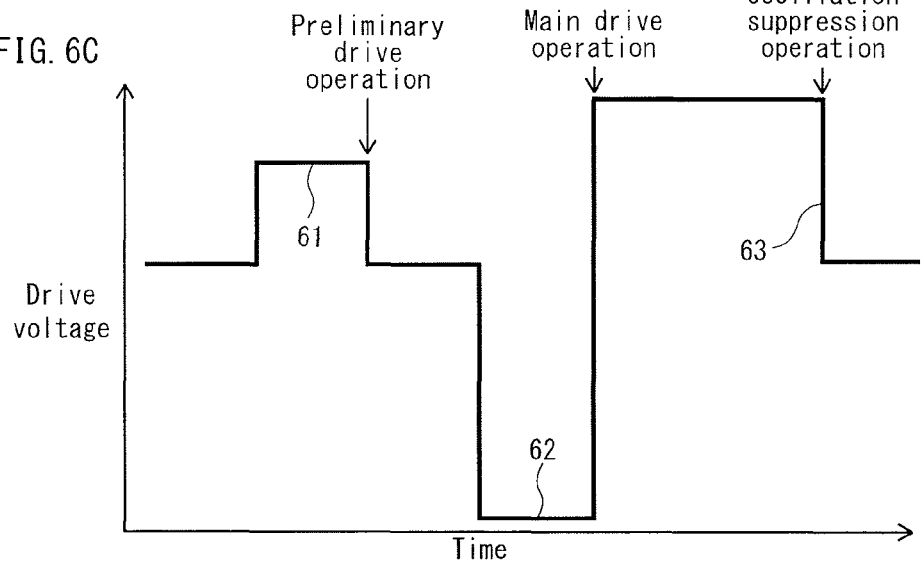

In the present embodiment, the drive voltage corresponding to the preliminary oscillatory waveform part is applied for performing the preliminary drive operation by the pull ejection method. Alternatively, the drive voltage corresponding to the preliminary oscillatory waveform part may be for example applied for performing the preliminary drive operation by the push ejection method as shown in FIG. 6C. In this case, the values of the displacement amount and waveform width of the drive voltage may be used that are the same as those in the present embodiment. Note that the preliminary drive operation by the pull ejection method is advantageous in that an application period necessary for one cycle of waveform is reduced. This is because the preliminary drive operation by the pull ejection method allows to push ink at a low drive voltage compared with the preliminary drive operation by the push ejection method, thereby reducing the displacement amount of drive voltage.

<Main Oscillatory Waveform Part>

Drive voltage corresponding to the main oscillatory waveform part is applied for performing the main drive operation. The displacement amount Y of the drive voltage corresponding to the main oscillatory waveform part is set in accordance with the physical properties of the used ink such that ink droplets are ejected in the main drive operation. In the present embodiment, since the preliminary drive operation is performed prior to the main drive operation, it is possible to uniformize positive pressure to be applied to the ink surface in the main drive operation. Accordingly, the displacement amount Y of the drive voltage is suppressed low compared with the case where the preliminary drive operation is not performed, and driving at this low drive voltage allows to reduce an application period necessary for one cycle of waveform.

The waveform width C of the main oscillatory waveform part is set such that oscillation that remains on the ink surface due to application of the drive voltage corresponding to the preliminary oscillatory waveform part does not resonate with oscillation that occurs due to the main drive operation. The waveform width C is for example set to T/2 that is half the period T of the helmholtz resonance frequency in the ink housing unit.

In the present embodiment, the drive voltage corresponding to the main oscillatory waveform part is applied for performing the main drive operation by the pull ejection method. Alternatively, the drive voltage corresponding to the main oscillatory waveform part may be applied for performing the main drive operation by the push ejection method as shown in FIG. 6A. In this case, the values of the displacement amount and waveform width of the drive voltage may be used that are the same as those in the present embodiment. Note that the main drive operation by the pull ejection method is advantageous in that an application period necessary for one cycle of waveform is reduced. This is because the main drive operation by the pull ejection method allows to eject ink droplets at a low drive voltage compared with the main drive operation by the push ejection method, thereby reducing the displacement amount of drive voltage.

<Oscillation Suppression Waveform Part>

Drive voltage corresponding to the oscillation suppression waveform part is opposite to the drive voltage corresponding to the main oscillatory waveform part, and is applied for suppressing amplitude of oscillation remaining on the ink surface due to the main drive operation. In consideration of the relationship with the displacement amount Y of the drive voltage corresponding to the main oscillatory waveform part, a preferable range of the displacement amount Z of the drive voltage corresponding to the oscillation suppression waveform part is set such that 30%≤Z/Y is satisfied. This preferably suppresses the amplitude of oscillation that remains on the ink surface due to the main drive operation. The upper limit of the displacement amount Z is not particularly limited. However, since increase in displacement amount of drive voltage increases an application period necessary for one cycle of waveform, the upper limit of the displacement amount Z should be set such that Z/Y≤60% is satisfied.

Also, in the case where the waveform configuration of drive voltage in the present embodiment shown in FIG. 7 is used, which includes the preliminary oscillatory waveform part 61, the main oscillatory waveform part 62, and the oscillation suppression waveform part 63, relationship X/Y+Z/Y≤100% needs to be satisfied. Accordingly, the upper limit of the proportion in displacement amount Z/Y is also defined in accordance with the proportion in displacement amount X/Y relating to the drive voltage which is necessary for performing the preliminary drive operation.

The waveform width D of the oscillation suppression waveform part is set such that oscillation that occurs due to the oscillation suppression operation does not resonate with oscillation that remains on the ink surface due to application of drive voltage corresponding to the main oscillatory waveform part, and furthermore such that amplitude of the remaining oscillation is attenuated as much as possible. The waveform width D is for example set to T/2 that is half the period T of the helmholtz resonance frequency in the ink housing unit.

In the present embodiment, the waveform configuration of drive voltage includes the oscillation suppression waveform part. However, the oscillation suppression waveform part is not essential. Also in the present embodiment, the drive voltage corresponding to the oscillation suppression waveform part is applied as shown in FIG. 7 such that there is no displacement amount between the drive voltage corresponding to the oscillation suppression waveform part and the drive voltage corresponding to the preliminary oscillatory waveform part. In other words, when the oscillation suppression operation is started, the drive voltage is immediately decreased to the drive voltage at the start time of the preliminary drive operation. However, the drive voltage corresponding to the oscillation suppression waveform part is not limited to being applied in this way. Alternatively, the drive voltage corresponding to the oscillation suppression waveform part may be applied such as shown in FIG. 6A such that the displacement amount Z gradually increases step by step between the drive voltage corresponding to the preliminary oscillatory waveform part and the drive voltage corresponding to the oscillation suppression waveform part. Further alternatively, the drive voltage corresponding to the oscillation suppression waveform part may be applied such that the oscillation suppression waveform part have a rectangle shape by performing the oscillation suppression operation at the displacement amount Z having a larger value than the displacement amount Z shown in FIG. 7, keeping the drive voltage for a certain period, and then applying the drive voltage corresponding to the oscillation suppression waveform part until immediately before application of the drive voltage corresponding to the preliminary oscillatory waveform part.

<Others>

The wave configuration of the drive voltage in the present embodiment includes the preliminary oscillatory waveform part, which is independent from the main oscillatory waveform part. Accordingly, there is a relay period B between the application period of the drive voltage corresponding to the preliminary oscillatory waveform part and the application period of the drive voltage corresponding to the main oscillatory waveform part. The relay period B is set such that oscillation that remains on the ink surface due to application of the drive voltage corresponding to the preliminary oscillatory waveform part does not resonate with oscillation that occurs due to application of the drive voltage corresponding to the main oscillatory waveform part for expanding the ink housing unit. The relay period B is for example set to T/2 that is half the period T of the helmholtz resonance frequency in the ink housing unit.

In the case where there is a relay period between the application period of the drive voltage corresponding to the preliminary oscillatory waveform part and the application period of the drive voltage corresponding to the main oscillatory waveform part, and or between the application period of the drive voltage corresponding to the main oscillatory waveform part and the application period of the drive voltage corresponding to the oscillation suppression waveform part, the relay period should be set such that oscillation that remains on the ink surface due to previous or immediately previous application of drive voltage does not resonate with oscillation that occurs on the ink surface due to subsequent application of drive voltage. The relay period should be preferably for example set to T/2 that is half the period T of the helmholtz resonance frequency in the ink housing unit.

<Experiment and Analysis>

(Improvement in Landing Accuracy of Ink Droplet Owing to Preliminary Drive Operation)

As described above, the present inventor got the findings that, by pushing ink toward the outer edge of the nozzle, more specifically by flattening the meniscus shape of the ink surface, prior to the drive operation for ejecting the ink droplet, it is possible to suppress generation of an ink droplet having volume smaller than the defined volume and ensure ejection of an ink droplet having the defined volume. Then, the present inventor reached a conclusion that, it is possible to give sufficient motion energy to an ink droplet to the extent that influence of surface tension of ink adhering near the nozzle can be ignored, thereby effectively preventing deflection of a flight course of the ink droplet. The following describes results of a verification experiment that lead to the above conclusion with reference to FIG. 8A and FIG. 8B.

Figure 8A:
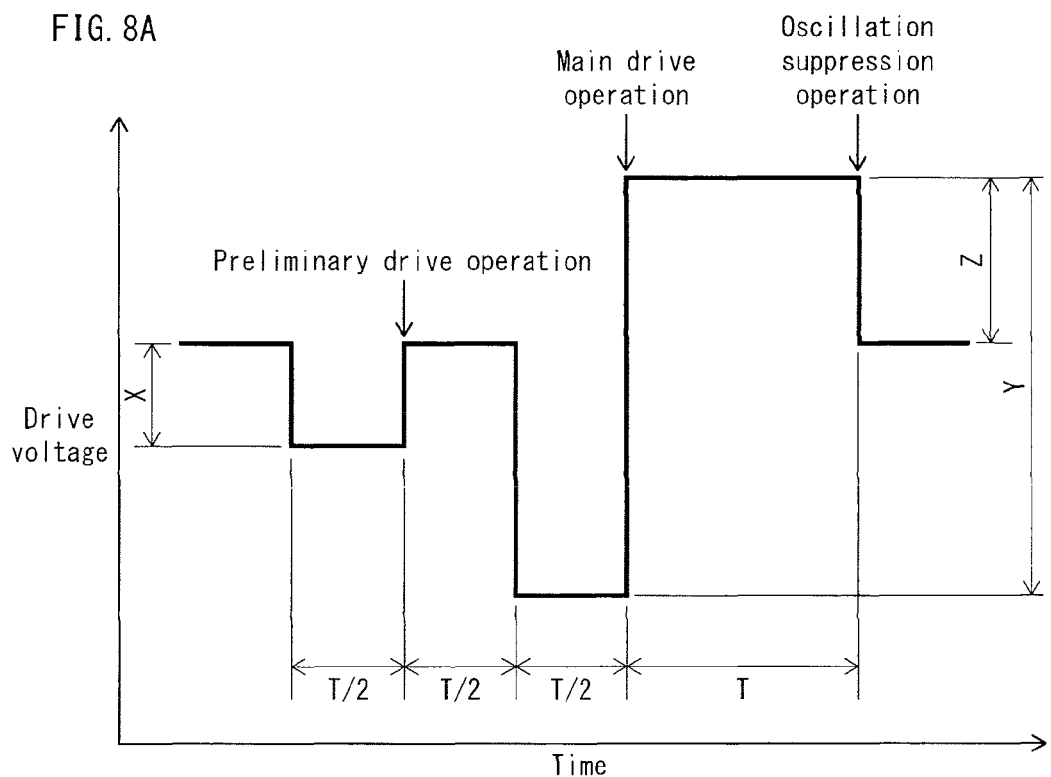
FIG. 8A shows drive waveform of drive voltage used in a verification experiment.
Figure 8B:
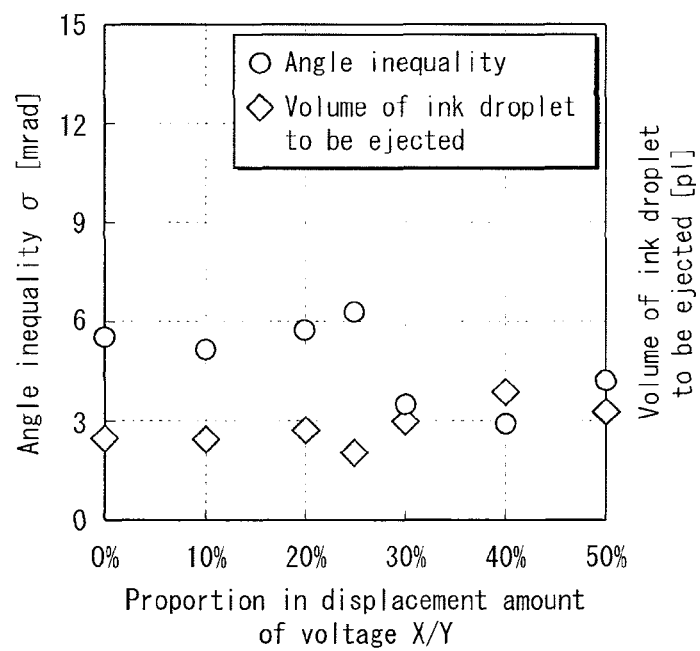
FIG. 8B shows correlation among a proportion in displacement amount X/Y, volume of an ink droplet to be ejected, and angle inequality in ejection direction relating to a landing position of the ink droplet, where X indicates a displacement amount of drive voltage for performing the preliminary drive operation, and Y indicates a displacement amount of drive voltage for performing the main drive operation.

FIG. 8A shows drive waveform of drive voltage used in the verification experiment. FIG. 8B shows correlation among the proportion in displacement amount X/Y, volume of an ink droplet to be ejected, and angle inequality in ejection direction relating to a landing position, where X indicates the displacement amount of the drive voltage for performing the preliminary drive operation, and Y indicates the displacement amount of the drive voltage for performing the main drive operation. In the verification experiment, driving voltage having the same waveform configuration as that shown in FIG. 7 was applied, which includes the preliminary oscillatory waveform part for performing the preliminary drive operation, the main oscillatory waveform part for performing the main drive operation, and the oscillation suppression waveform part for performing the oscillation suppression operation. In the verification experiment, an ink jet head was used, which includes an ink housing unit having a nozzle with diameter of 20 μm and the cycle T of the Helmholtz resonance frequency in the ink housing unit was 6 μs. Waveform width of each of the waveform parts and relay time between the application period of the drive voltage corresponding to the preliminary oscillatory waveform part and the application period of the drive voltage corresponding to the main oscillatory waveform part were set in accordance with the cycle T. Also, the displacement amount Z of the drive voltage for performing the oscillation suppression operation was set such that Z/Y=40% is satisfied. Furthermore, the displacement amount Y of the drive voltage was set to substantially 20 V such that ejection speed has a constant value (5 m/s). Frequency of the drive voltage was set a high frequency domain of 10 kHz according to which landing accuracy of an ink droplet extremely deteriorates. Angle inequality and volume of an ink droplet to be ejected shown in FIG. 8B were measured by spot observation through magnification photographing using a microscope provided with a high-speed camera. Such magnification photographing allows to clearly capture shape, an ejection direction, and so on of a flying ink droplet. The angle inequality was obtained by measuring a value based on definition in which angle of 0 is determined in the case where an ink droplet ejected through the nozzle travels straight toward an application target substrate. The volume of the ink droplet was obtained by calculating area of a region having a value darker than an appropriate threshold value from a lateral image of a spherical droplet, and converting the calculated area into a three-dimensional volume. The threshold value was manually adjusted so as to be equivalent to the outer periphery of the droplet with reference to the lateral image. The ink used in the verification experiment shown in FIG. 8B is the same as ink (i) included in various types of inks used in a verification experiment shown in FIG. 9, which is described later. In the verification experiment, with respect to each of ink samples for the verification experiment, 30 droplets were ejected through each of 10 nozzles having the same diameter in order to check reproducibility of the results of the verification experiment. Data points shown in the figure each indicate a standard deviation of the results of the verification experiment (angle inequality) or a mean value of the results of the verification experiment (volume of an ink droplet to be ejected).

Since the drive frequency is in the high frequency domain, in the case where the drive voltage corresponding to the preliminary oscillatory waveform part was not applied, there existed significantly large angle inequality of an ink droplets to be ejected as shown in FIG. 8B. This extremely deteriorates landing accuracy of the ink droplet. Here, the proportion in displacement amount X/Y of drive voltage was increased by increasing the displacement amount X of the drive voltage for performing the preliminary drive operation while keeping the displacement amount Y set to substantially a constant value. As a result, the angle inequality significantly decreased. Also, while the angle inequality decreased, the volume of the ink droplet increased. The verification experiment demonstrated that application of the drive voltage corresponding to the preliminary oscillatory waveform part remarkably improves the landing accuracy of the ink droplet, and that the effects of improvement in landing accuracy are exhibited especially in the case where the drive frequency is in the high frequency domain according to which the landing accuracy of the ink droplet normally deteriorates.

(Optimal Range of Displacement Amount of Drive Voltage Corresponding to Preliminary Oscillatory Waveform Part)

As clear from the above results of the verification experiment shown in FIG. 8B, when the proportion in displacement amount X/Y of drive voltage is equal to or higher than a certain value, the angle inequality of an ink droplet to be ejected, which indicates the landing accuracy of the ink droplet, significantly decreases. Specifically, the results of the verification experiment demonstrates that in the case where the displacement amount X of the drive voltage for performing the preliminary drive operation is set such that the proportion in displacement amount X/Y is 30% or higher, the effects obtained by performing the preliminary drive operation are remarkably exhibited. The results of the verification experiment also demonstrates that in the case where the upper limit of the proportion in displacement amount X/Y is set to 50%, volume of the ink droplet to be ejected is sufficiently secured as shown in FIG. 8B, and as a result the landing accuracy is sufficiently secured.

(Relationship Between Physical Properties of Ink and Preliminary Drive Operation)

Physical properties of ink might deteriorate landing accuracy of an ink droplet because of contributing to ink ejection behavior, more specifically to the meniscus shape of an ink surface. In view of this, the present inventor focused on viscosity and trail length among the physical properties of ink, and verified the effects of the preliminary drive operation, with use of inks having various types of physical properties shown in FIG. 9. The inks used in the verification experiment in FIG. 9 each contain CHB (cyclohexylbenzene) as solvent, and each contain F8-F6 (copolymer of F8 (poly dioctylfluorene) and F6 (poly dihexylfluorene)) as solute. The inks differ in terms of concentration from each other. In the figure, a hatched triangle indicates ink containing solute having weight-average molecular weight of 200000, and a hatched rectangle indicates ink containing solute having weight-average molecular weight of 400000. The trail length is length of a linear trail extending backward from part of an ejected ink droplet. Similarly to the angle inequality and the volume shown in FIG. 8B, the trail length was measured by spot observation of a flying ink droplet through magnification photographing using a microscope provided with a high-speed camera. The viscosity was measured under the conditions of 20 degrees C. with use of the rheometer AR-G2 manufactured by TA Instruments, Inc.

<Viscosity>

Figure 9:
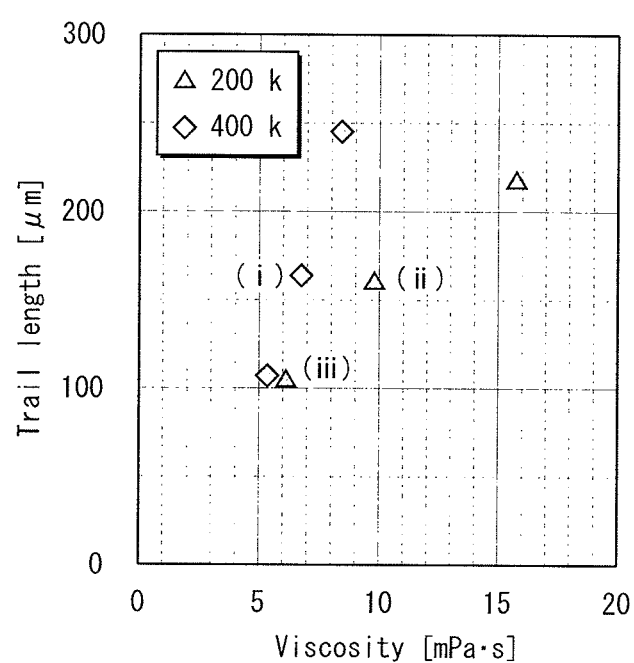
FIG. 9 shows viscosity and trail length of ink used in the verification experiment.

In order to verify the effects of the preliminary drive operation exercised on ink viscosity, verification experiment was made on ink (i) and ink (ii) shown in FIG. 9. The ink (i) and the ink (ii) have the same trail length of an ink droplet, and the ink (i) is lower in terms of viscosity than the ink (ii). Conditions for the verification experiment were the same as those in the verification experiment described with reference to FIG. 8A. In this verification experiment, frequency of drive voltage was set to a high frequency domain (10 kHz) according to which ink tends to adhere near the nozzle and a low frequency domain (1 kHz) according to which ink tends not to adhere near the nozzle.

Figure 10A:
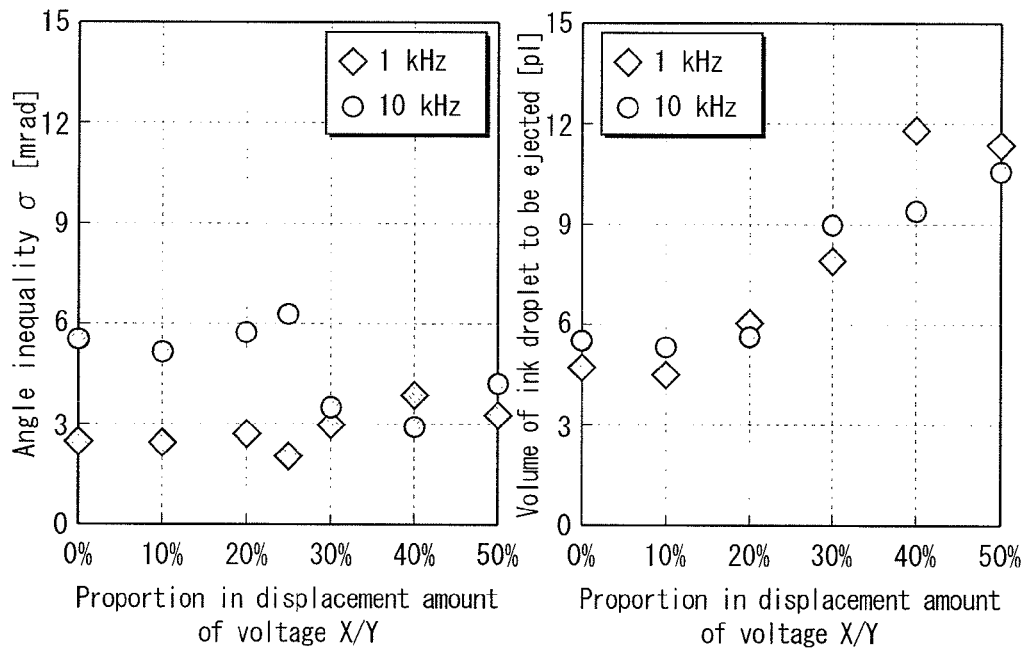
FIG. 10A and FIG. 10B show correlation between angle inequality and volume of an ink droplet to be ejected, relative to viscosity, with respect to ink (i) and ink (ii) shown in FIG. 9, respectively.
Figure 10B:
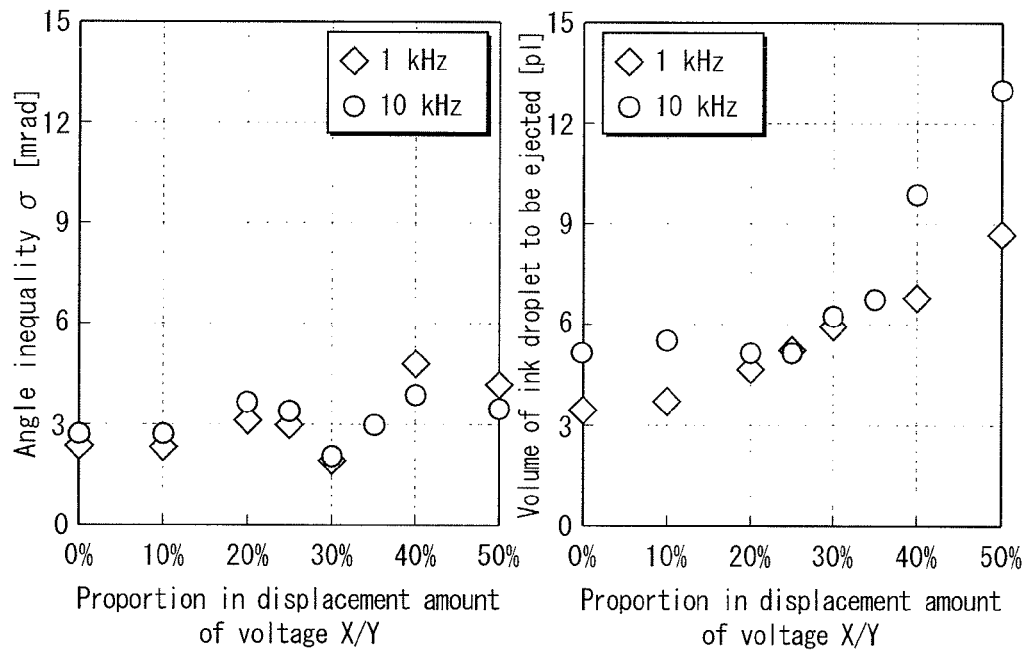

FIG. 10A and FIG. 10B show correlation between angle inequality and volume of an ink droplet to be ejected, relative to viscosity. FIG. 10A and FIG. 10B correspond to the ink (i) and the ink (ii) shown in FIG. 9, respectively. The measuring method and definition of the angle inequality and the volume of the ink droplet to be ejected are the same as those shown in FIG. 8B. In the case where the preliminary drive operation is not performed, the ink having the lower viscosity is significantly higher in terms of angle inequality than the ink having the higher viscosity, with respect to the drive frequency in the high frequency domain (the left graph in FIG. 10A). The decrease in viscosity causes an ink droplet having volume smaller than the defined volume to tend to fly, and increases an amount of ink adhering near the nozzle. Furthermore, a flight course of such an ink droplet particularly tends to be deflected due to the smaller volume of the ink droplet. It is considered that, especially with respect to the drive frequency in the high frequency domain, since ink tends to adhere near the nozzle, angle inequality significantly increases. Here, the proportion in displacement amount X/Y of drive voltage was increased by increasing the displacement amount X of the drive voltage for performing the preliminary drive operation while keeping the displacement amount Y set to substantially a constant value. As a result, the angle inequality significantly decreased (the left graph in FIG. 10A). Also, while the angle inequality decreased, the volume of the ink droplet increased (the right graph in FIG. 10A). This demonstrates that the preliminary drive operation allows to stably eject an ink droplet having the defined volume, effectively prevents deflection of a flight course of even the ink droplet having the lower viscosity, and as a result improves the landing accuracy of the ink droplet. Especially when the drive frequency is set to the high frequency domain, the above effects are remarkably exhibited.

In the case where the ink having the higher viscosity is used, small angle inequality exists with respect to both the drive frequency in the low frequency domain and the drive frequency in the high frequency domain, and excellent landing accuracy of an ink droplet is exhibited (the left graph in FIG. 10B). In other words, the increase in viscosity suppresses fly of an ink droplet having volume smaller than the defined volume, and as a result an ink droplet is ejected while volume of the ink droplet is stably secured. In the case where the ink having the higher viscosity was used, volume of an ink droplet to be ejected also increased by the preliminary drive operation (the right graph in FIG. 10B). Accordingly, it is possible to suppress the displacement amount of the drive voltage necessary for ink droplet ejection, thereby exhibiting an advantage that an application period necessary for one cycle of waveform for ink droplet ejection is reduced.

<Trail Length>

In order to verify the effects of the preliminary drive operation exercised on trail length of an ink droplet, verification experiment was made on the ink (i) and ink (iii) shown in FIG. 9. The ink (i) and the ink (iii) have the same viscosity, and the ink (i) is longer in terms of trail length than the ink (iii). Conditions for the verification experiment were the same as those in the verification experiment described with reference to FIG. 8A. In this verification experiment, frequency of drive voltage was set to a high frequency domain (10 kHz) according to which ink tends to adhere near the nozzle and a low frequency domain (1 kHz) according to which ink tends not to adhere near the nozzle.

Figure 11A:
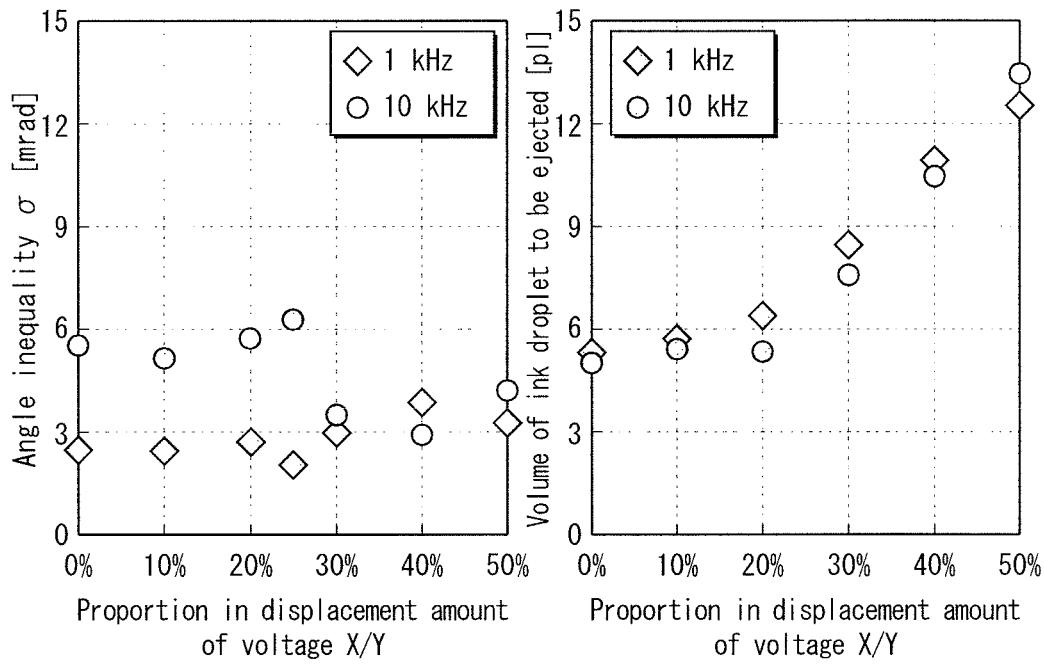
FIG. 11A and FIG. 11B show correlation between angle inequality and volume of an ink droplet to be ejected, relative to trail length, with respect to the ink (i) and ink (iii) shown in FIG. 9, respectively.
Figure 11B:
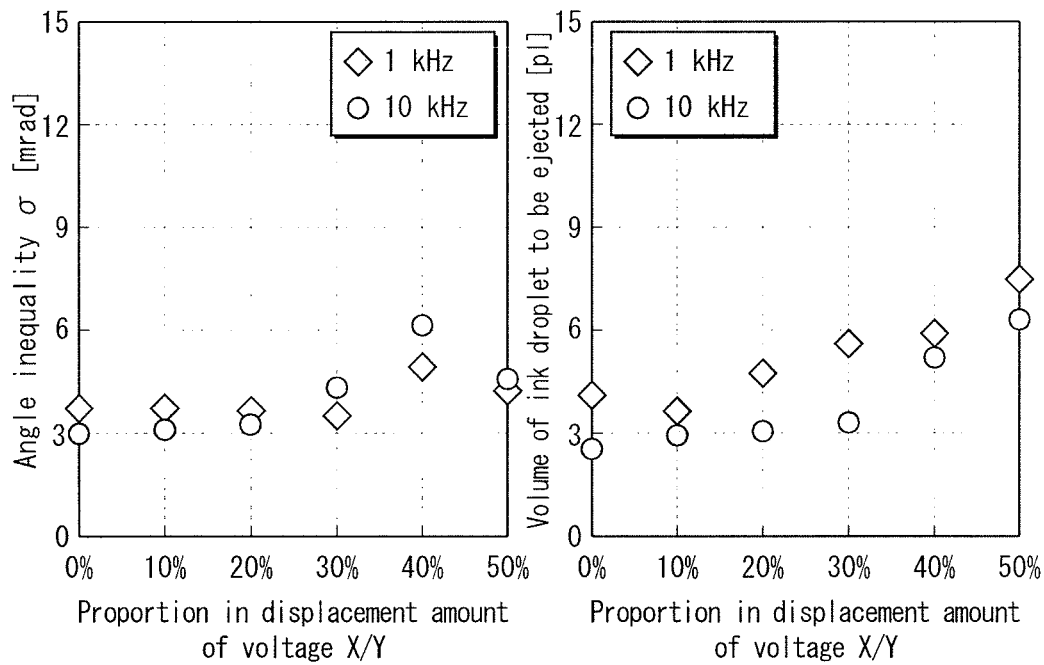

FIG. 11A and FIG. 11B show correlation between angle inequality and volume of an ink droplet to be ejected, relative to trail length. FIG. 10A and FIG. 10B correspond to the ink (i) and the ink (iii) shown in FIG. 9, respectively. The measuring method and definition of the angle inequality and the volume of the ink droplet to be ejected are the same as those shown in FIG. 8B. In the case where the preliminary drive operation is not performed, the ink having the longer trail is extremely higher in terms of angle inequality than the ink having the shorter trail, with respect to the drive frequency in the high frequency domain (the left graph in FIG. 11A). The increase in trail length increases a contact period of an ink droplet with ink adhering near the nozzle, and as a result a flight course of the ink droplet is in particular easily deflected. It is considered that, especially with respect to the drive frequency in the high frequency domain, since ink tends to adhere near the nozzle, angle inequality extremely increases. Here, the proportion in displacement amount X/Y of drive voltage was increased by increasing the displacement amount X of the drive voltage for performing the preliminary drive operation while keeping the displacement amount Y set to substantially a constant value. As a result, the angle inequality significantly decreased with respect to drive frequency in the high frequency domain (the left graph in FIG. 11A). Also, while the angle inequality decreased, the volume of the ink droplet increased (the right graph in FIG. 11A). This demonstrates that the preliminary drive operation allows to stably eject an ink droplet having the defined volume, effectively prevents deflection of a flight course of even the ink droplet having the longer trail, and as a result improves the landing accuracy of the ink droplet. Especially when the drive frequency is set to the high frequency domain, the above effects are remarkably exhibited.

In the case where the ink having the shorter trail is used, small angle inequality exists with respect to both the drive frequency in the low frequency domain and the drive frequency in the high frequency domain, and excellent landing accuracy of an ink droplet is exhibited (the left graph in FIG. 11B). The decrease in trail length decreases a contact period of an ink droplet with ink adhering near the nozzle, and straight flight of the ink droplet is ensured with no deflection of a flight course of the ink droplet. In the case where the ink having the shorter trail was used, volume of an ink droplet to be ejected also increased by the preliminary drive operation (the right graph in FIG. 11B). Accordingly, it is possible to suppress the displacement amount of the drive voltage necessary for ink droplet ejection, thereby exhibiting an advantage that an application period necessary for one cycle of waveform for ink droplet ejection is reduced.

(Relationship Between Drive Frequency and Preliminary Drive Operation)

As shown in FIG. 10A and FIG. 11A, when drive frequency is set to the high frequency domain, angle inequality extremely increases, and as a result landing accuracy of an ink droplet extremely deteriorates. With respect to the drive frequency in the high frequency domain, since an ejection interval of ink droplets is reduced per unit time, and as a result ink tends to adhere near the nozzle, and also the number of contacts of a subsequent ink droplet with the adhering ink increases per unit time. However, as shown in FIG. 10A and FIG. 11A, since the preliminary drive operation allows to stably eject an ink droplet having the defined volume, the angle inequality dramatically decreases, and as a result the landing accuracy of the ink droplet is greatly improved. In this verification experiment, the drive frequency is set to the high frequency domain of 10 kHz and the low frequency domain of 1 kHz. The verification experiment demonstrated that the preliminary drive operation improves especially the landing accuracy of the ink droplet, at least with respect to the high frequency domain of the drive frequency of 10 kHz or higher. Although there is no special reason for limitation on the upper limit of the drive frequency, setting of the upper limit to 20 kHz for example responds a demand for increase in frequency at present.

Embodiment 2

Before description is given on a manufacturing method of an organic EL device relating to the present embodiment, description is given on the configuration of an organic EL device to be manufactured by the manufacturing method relating to the present embodiment.

<Configuration of Organic EL Device 100>

Figure 12:
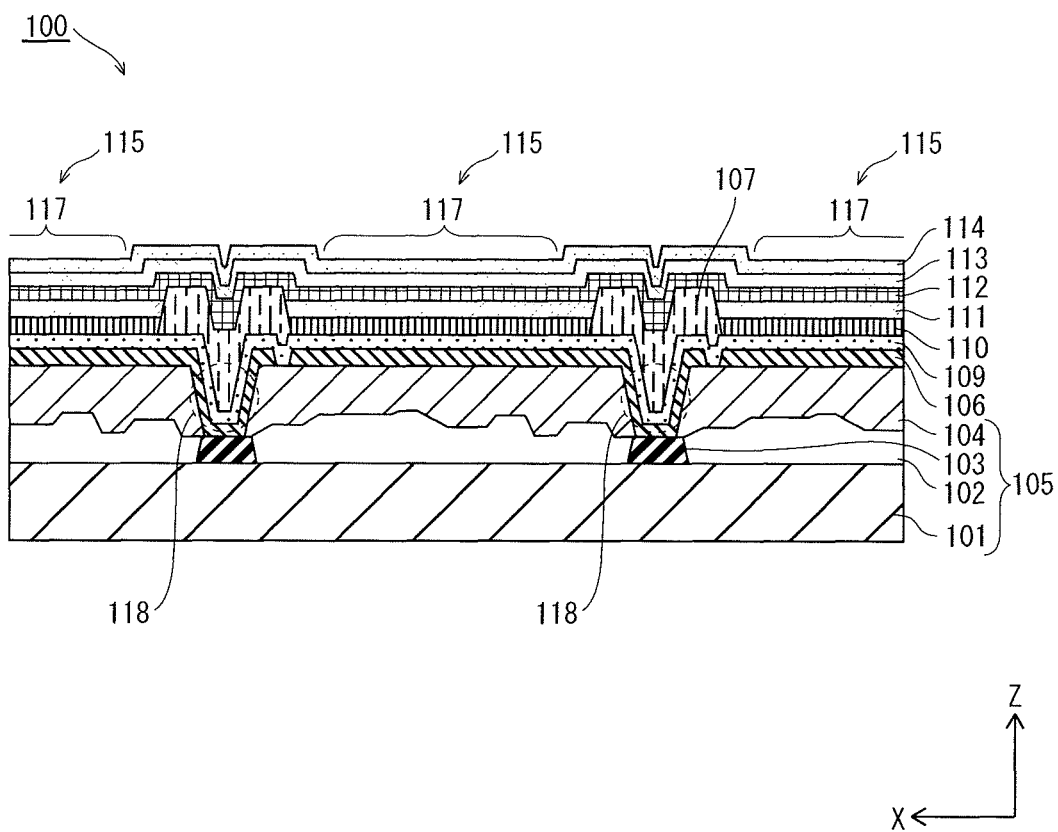
FIG. 12 is a partial cross-sectional view of an organic EL device 100 manufactured by a manufacturing method of an organic EL device relating to an embodiment of the present invention.

FIG. 12 is a partial cross-sectional view of an organic EL device 100 manufactured by the manufacturing method of an organic EL device relating to the present embodiment. Although the organic EL device 100 shown in FIG. 12 is illustrated as an organic EL display panel including a plurality of organic EL elements 115, this is just an example. Alternatively, the organic EL device 100 may include a single organic EL element.

The organic EL device 100 is of a so-called top emission type, and has a display surface on the upper side in the figure.

As shown in FIG. 12, a TFT (thin film transistor) layer 102, feed electrodes 103, and a planarizing film 104 are layered on a substrate body 101 in this order. A substrate 105 is constituted from the substrate body 101, the TFT layer 102, the feed electrodes 103, and the planarizing film 104. Pixel electrodes 106 and a hole injection layer 109 are layered on the substrate 105 in this order. A barrier rib layer 107 is formed on the hole injection layer 109. Each adjacent two portions of the barrier rib layer 107 have an aperture 117 therebetween, in which a light-emitting layer 111 is to be formed. A hole transport layer 110 and the light-emitting layer 111 are layered in the aperture 117 in this order. An electron transport layer 112, an electron injection layer 113, and a common electrode 114 are layered in this order on each of the light-emitting layers 111 and the barrier rib layer 107. In the present embodiment, the hole injection layer 109, the hole transport layers 110, the light-emitting layers 111, the electron transport layer 112, and the electron injection layer 113 are each equivalent to the functional layer of the present invention. Also, the pixel electrodes 106 and the common electrode 114 are equivalent to the first electrode and the second electrode of the present invention, respectively.

<Substrate>

The substrate body 101 is a back substrate of the organic EL device 100, and has a surface on which the TFT layer 102 including TFTs is formed to drive the organic EL device 100 by an active matrix method. The TFT layer 102 has the feed electrodes 103 formed thereon for feeding external electrical power to the TFTs.

The planarizing film 104 is provided for planarizing surface level difference caused by provision of the TFT layer 102 and the feed electrodes 103. The planarizing film 104 is made of organic material having excellent electrically-insulating properties.

The substrate 105, which is constituted from the substrate body 101, the TFT layer 102, the feed electrodes 103, and the planarizing film 104, is equivalent to the substrate of the present invention.

<Contact Holes 118>

Contact holes 118 are provided for electrically connecting the feed electrodes 103 with the pixel electrodes 106, and are through-holes in the planarizing film 104. The contact holes 118 are each formed so as to position between each adjacent two apertures 117 which are arranged in the Y-direction, and are covered with the barrier rib layer 107. If the contact holes 118 are not covered with the barrier rib layer 107, the light-emitting layers 111 are not planar due to the existence of the contact holes 118, and this causes unevenness in light emission and so on. In order to avoid such unevenness in light emission and so on, the contact holes 118 have the above configuration.

<Pixel Electrodes 106>

The pixel electrodes 106 are anodes, and are each formed for each light-emitting layer 111 which is formed in the aperture 117. Since the organic EL device 100 is of the top emission type, the pixel electrodes 106 are made of highly light-reflective material. The pixel electrodes 106 are equivalent to the first electrodes of the present invention.

<Hole Injection Layer 109>

The hole injection layer 109 is provided in order to promote injection of holes from the pixel electrodes 106 to the light-emitting layers 111.

<Barrier Rib Layer 107>

The barrier rib layer 107 has a function of, when the light-emitting layers 111 are formed, preventing mixing of inks (liquid materials), which contain materials of light-emitting layers and solvent, between red (R), green (G), and blue (B) colors.

The barrier rib layer 107 is provided so as to cover the above of the contact holes 118, and has trapezoidal cross-sections along an X-Z plane or a Y-Z plane.

Figure 13:
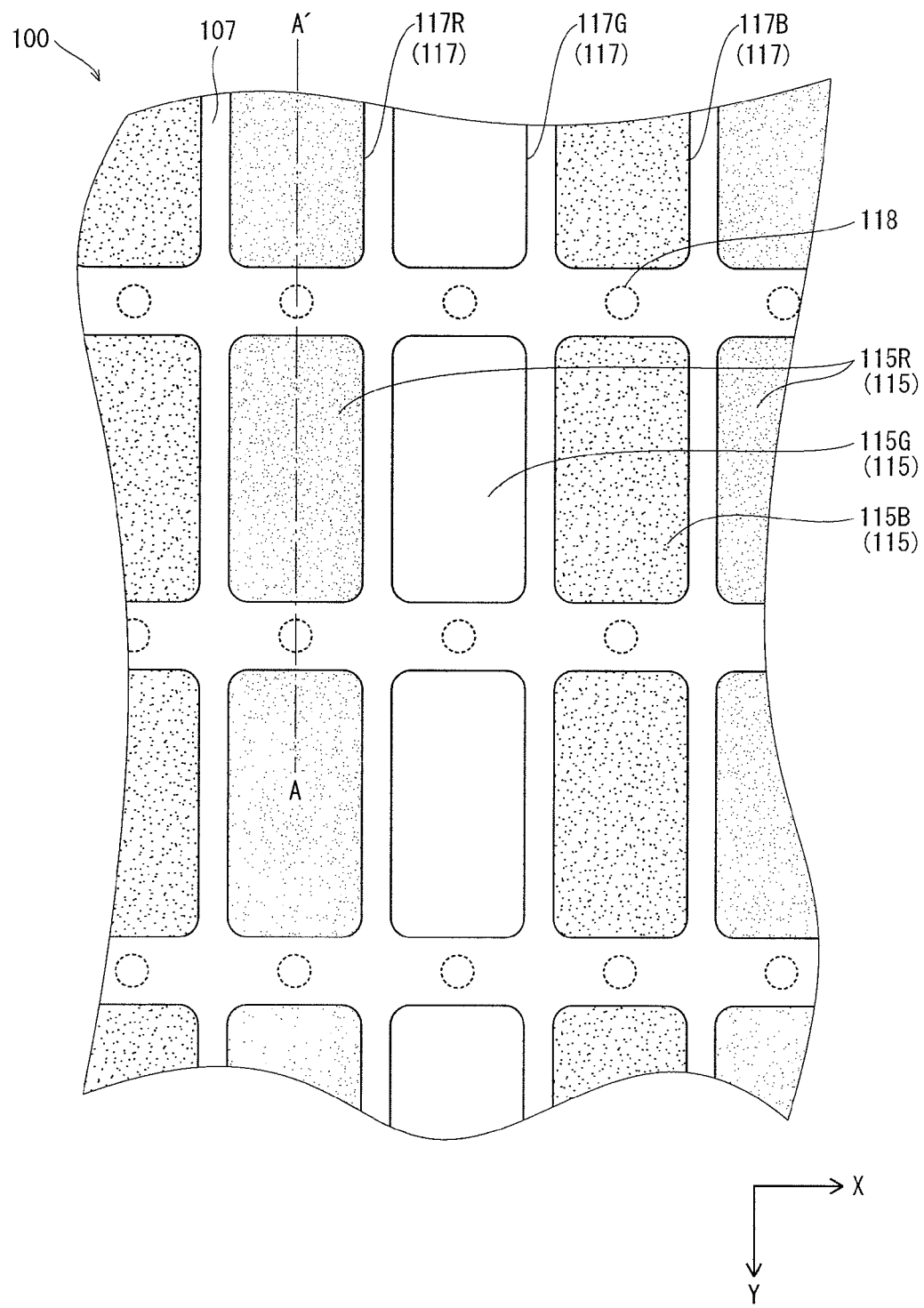
FIG. 13 schematically shows shape of a barrier rib layer of an organic EL display panel as the organic EL device 100 shown in FIG. 12.

FIG. 13 schematically shows the shape of the barrier rib layer 107 when the organic EL display panel as the organic EL device 100 is seen from the side of the display surface, where the hole transport layer 110, the light-emitting layers 111, the electron transport layer 112, the electron injection layer 113, and the common electrode 114 are omitted for convenience of the description. Note that the partial cross-sectional view in FIG. 12 is taken along a line A-A' in FIG. 13.

As shown in FIG. 13, the organic EL display panel 100 has the configuration in which a plurality of organic EL elements 115R of the R color, a plurality of organic EL elements 115G of the G color, and a plurality of organic EL elements 115B of the B color are arranged in the X-Y direction (in matrix). The organic EL elements 115R, 115G, and 115B are each a subpixel, and a combination of three subpixels of the organic EL elements 115R, 115G, and 115B corresponds to one pixel.

The apertures 117, which are formed in the barrier rib layer 107, are arranged in the X-Y direction each so as to correspond to one of the organic EL elements 115R, 115G, and 115B. The apertures 117 are each a region where the light-emitting layer 111 is to be formed. The arrangement and shape of the light-emitting layers 111 are defined in accordance with the arrangement and shape of the apertures 117. The apertures 117 are each a rectangle having a long side in the Y direction. Specifically, the apertures 117 for example each have a side of approximately 30 µm to 130 µm in the X direction (the column direction) and a side of approximately 150 μm to 600 μm in the Y direction (the row direction).

The apertures 117 are each specifically one of apertures 117R, 117G, and 117B that respectively correspond to the R, G, and B colors. The respective light-emitting layers 111 of the R, G, and B colors are respectively formed in the apertures 117R, 117G, and 117B. In other words, the apertures 117R, 117G, and 117B respectively correspond to the organic EL elements 115R, 115G, and 115B. Also, the apertures 117 are arranged in rows for each of the R, G, and B colors. The apertures 117 which belong to the same row are for the same color.

The contact holes 118 are each positioned between each adjacent two of the apertures 117 which are arranged in the Y direction, and in the lower part in the barrier rib layer 107. As described above, the pixel electrodes 106 are each formed for each of the light-emitting layers 111 formed in the apertures 117. This means that the pixel electrodes 106 are each provided for each subpixel.

<Hole Transport Layer 110>

Now back to the partial cross-sectional view in FIG. 12, the description continues. The hole transport layer 110 has a function of transporting holes injected by the pixel electrodes 106 to the light-emitting layers 111.

<Light-Emitting Layers 111>

The light-emitting layers 111 emit light through recombination of carriers, and each include light-emitting material corresponding to one of the R, G, and B colors. The respective light-emitting layers 111 including light-emitting materials of the R, G, and B colors are respectively formed in the apertures 117R, 117G, and 117B.

<Electron Transport Layer 112>

The electron transport layer 112 has a function of transporting electrons injected by the common electrode 114 to the light-emitting layers 111.

<Electron Injection Layer 113>

The electron injection layer 113 has a function of promoting injection of holes from the common electrode 114 to the light emitting layers 111.

<Common Electrode 114>

The common electrode 114 is a cathode, and is equivalent to the second electrode of the present invention. Since the organic EL display panel 100 is of the top emission type, the common electrode 114 is made of light-transmissive material.

<Others>

Although not shown in FIG. 12, a sealing layer is provided for suppressing deterioration of the light emitting layers 111 due to exposure to moisture, air, and so on. Since the organic EL display panel 100 is of the top emission type, the sealing layer is made of light-transmissive material such as SiN (silicon nitride) and SiON (silicon oxynitride).

Also, an ITO (indium tin oxide) layer or an IZO (indium zinc oxide) layer may be provided between each of the pixel electrodes 106 and the hole injection layer 109 for improving bondability therebetween. Furthermore, all the light-emitting layers 111 formed in the apertures 117 may be of the same color.

<Material of Layers>

The following shows examples of materials of the layers described above. It is of course possible to form the layers using materials other than materials shown below.

The substrate body 101: electrically-insulating material such as non-alkali glass, soda glass, nonfluorescent glass, phosphate glass, borate glass, quartz, acrylic resin, styrenic resin, polycarbonate resin, epoxy resin, polyethylene, polyester, silicone resin, and alumina The planarizing film 104: polyimide resin or acrylic resin The pixel electrodes 106: Ag (silver), Al (aluminum), alloy of silver, palladium, and copper, alloy of silver, rubidium, and gold, MoCr (alloy of molybdenum and chrome), or NiCr (alloy of nickel and chrome)

The barrier rib layer 107: acrylic resin, polyimide resin, or novolac-type phenolic resin The hole injection layer 109: metal oxide such as MoOx (molybdenum oxide), WOx (tungsten oxide), and MoxWyOz (molybdenum tungsten oxide), metal nitride, or metal oxynitride The hole transport layer 110: triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styryl-anthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, or tetraphenylbenzene derivative (all disclosed in Japanese Patent Application Publication No. H5-163488)

The light-emitting layers 111: F8-F6 (copolymer of F8 (poly dioctylfluorene) and F6 (poly dihexylfluorene)), or fluorescent material disclosed in Japanese Patent Application Publication No. H5-163488 such as oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group three metal, metal complex of oxine, and rare earth metal complex The electron transport layer 112: barium, phthalocyanine, or lithium fluoride The electron injection layer 113: nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, or quinoline complex derivative (all disclosed in Japanese Patent Application Publication No. H5-163488)

The common electrode 114: ITO or IZO

<Manufacturing Method of Organic EL Device 100>

First, description is given on an example of the overall manufacturing method of an organic EL display panel as the organic EL device 100. Then, detailed description is given on an application step included in a functional layer forming step of the manufacturing method.

<Outline>

Figure 14A:
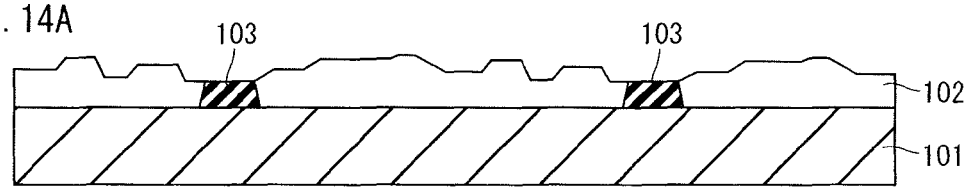
FIG. 14A to FIG. 14E are cross-sectional views schematically showing part of a manufacturing step of a manufacturing method of the organic EL device 100.

A substrate body 101 is prepared on which a TFT layer 102 and feed electrodes 103 are formed (FIG. 14A).

Figure 14B:
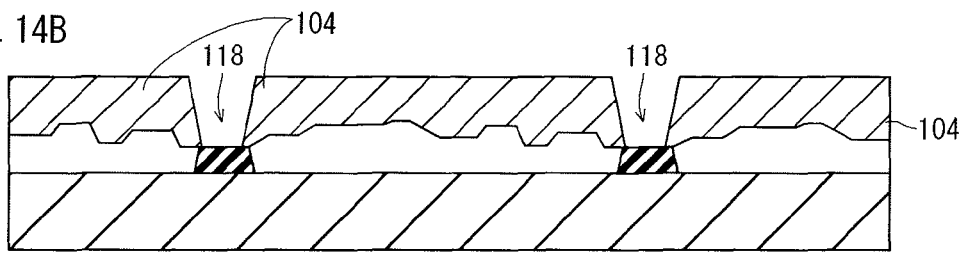

A planarizing film 104 having thickness of approximately 4 μm is formed on the TFT layer 102 and the feed electrodes 103 using organic material having excellent electrically-insulating properties by a photoresist method. At this stage, contact holes 118 are each formed in accordance with the position between each two apertures 117 which are adjacent to each other in the Y direction (FIG. 14B). By using the photoresist method in combination with a desirable pattern mask, the planarizing film 104 and the contact holes 118 can be formed simultaneously. The contact holes 118 are of course not limited to being formed by this method. Alternatively, the contact holes 118 may be for example formed by, after uniformly forming the planarizing film 104, removing portions of the planarizing film 104 at predetermined positions. This completes a step of forming the substrate 105.

Then, a pixel electrode 106 is formed on the substrate 105 for each subpixel by a vacuum deposition method or a sputtering method, so as to be electrically connected to a corresponding one of the feed electrodes 103. The pixel electrode 106 has thickness of approximately 150 nm and is made of metal material. This step of forming the pixel electrodes 106 on the substrate 105 is equivalent to the forming the first electrode of the present invention.

Figure 14C:
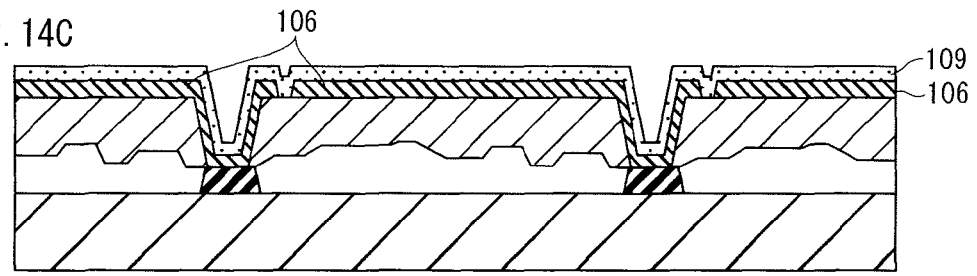

Next, a hole injection layer 109 is formed by a reactive sputtering method (FIG. 14C).

Figure 14D:
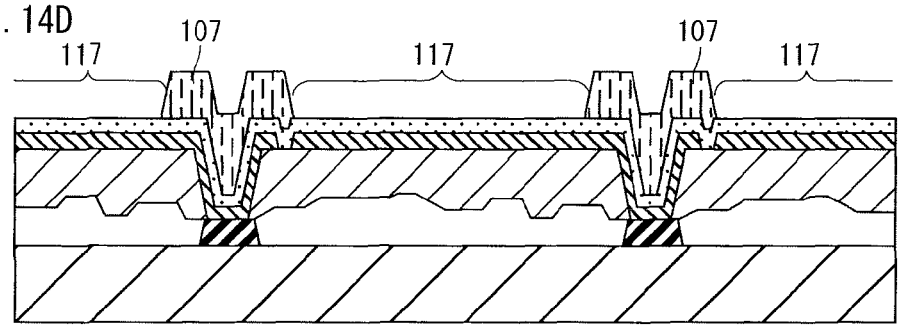

Next, a barrier rib layer 107 is formed by a photolithography method. Firstly, material including photosensitive resist in paste form is prepared as material of barrier rib layer. The material of barrier rib layer is uniformly applied on the hole injection layer 109. A mask shaped into a pattern of the apertures 117 shown in FIG. 13 is overlaid on the applied material of barrier rib layer. Next, the material of barrier rib layer on which the mask is overlaid is exposed to light. As a result, a pattern of barrier rib layer is formed. Subsequently, excess part of the material of barrier rib layer is washed off with an aqueous or non-aqueous etchant (developer). This completes patterning of the material of barrier rib layer. In this way, the apertures 117 in which light-emitting layers 111 are to be formed are defined, and the barrier rib layer 107 having repellency at least on a surface thereof is complete (FIG. 14D).

Note that during a step of forming the barrier rib layer 107, the surface of the barrier rib layer 107 may be treated with predetermined alkaline solution, water, or organic solvent, or by plasma treatment, in order to adjust the angle of contact between the barrier rib layer 107 and ink for hole transport layer and between the barrier rib layer 107 and ink for organic light-emitting layers to be applied to the apertures 117 in a subsequent step, or to provide the surface of the barrier rib layer 107 with repellency.

Figure 14E:
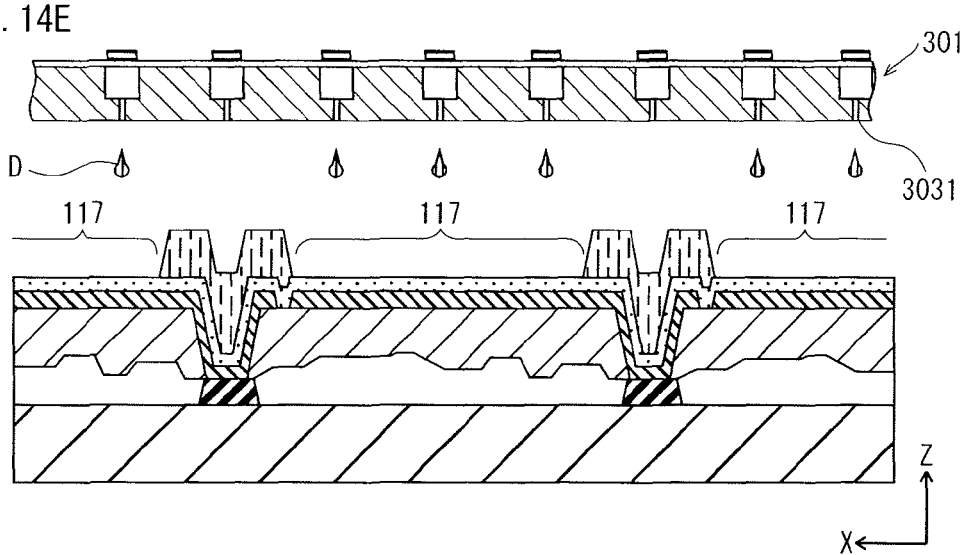
Figure 15A:
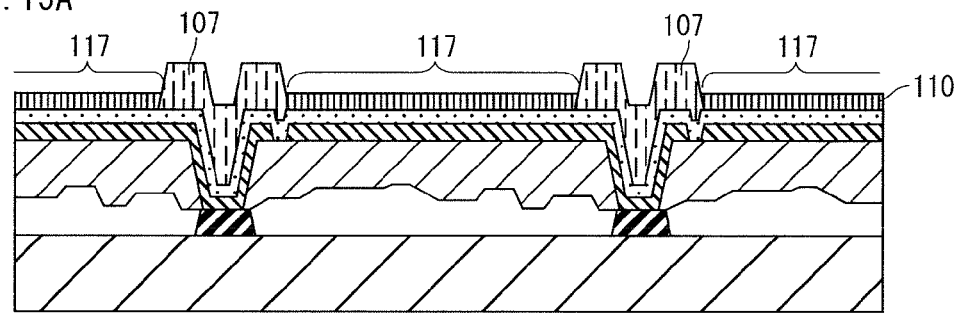
FIG. 15A to FIG. 15D are cross-sectional views schematically showing part of the manufacturing step of the manufacturing method of the organic EL device 100.

Next, the ink for hole transport layer is prepared by mixing material of a hole transport layer 110 and solvent at a predetermined ratio. The ink for hole transport layer is supplied to the ink jet heads 301, and droplets D as the ink for hole transport layer are ejected through the nozzles 3031 (see FIG. 3) corresponding to the apertures 117 in the application step (FIG. 14E). Then, the solvent contained in the ink is evaporated and dried, and is further heated and baked as necessary. As a result, the hole transport layer 110 is formed (FIG. 15A).

Figure 15B:
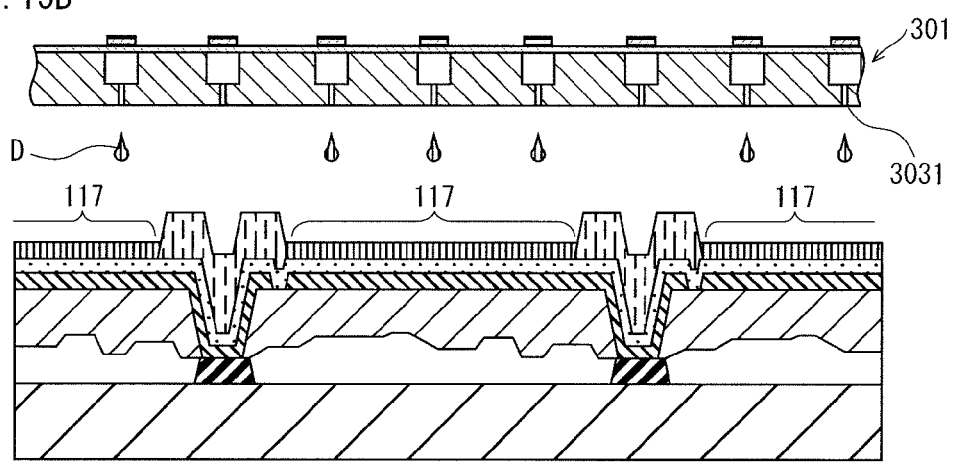
Figure 15C:
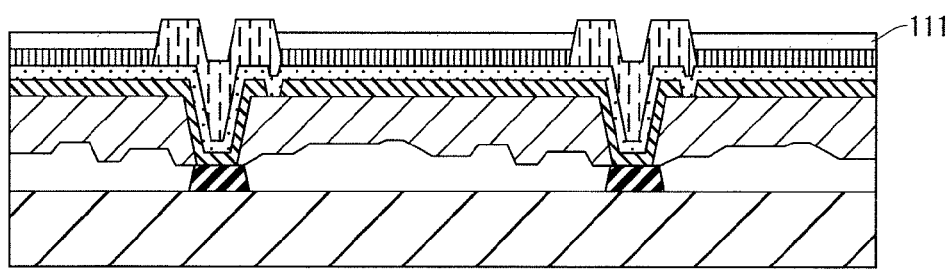

Next, the ink for organic light-emitting layers is prepared by mixing organic material of the light-emitting layers 111 and solvent at a predetermined ratio. The ink for organic light-emitting layers is supplied to the ink jet heads 301, and droplets D as the ink for organic light-emitting layers are ejected through the nozzles 3031 corresponding to the apertures 117 in the application step (FIG. 15B). Then, the solvent contained in the ink is evaporated and dried, and is further heated and baked as necessary. As a result, the light-emitting layers 111 are formed (FIG. 15C).

Next, material of an electron transport layer 112 is formed on surfaces of the light-emitting layers 111 by the vacuum deposition method. As a result, the electron transport layer 112 is formed. Subsequently, material of an electron injection layer 113 is formed by a vapor deposition method, a spin-coat method, a cast method, or the like. As a result, the electron injection layer 113 is formed. Steps of forming the hole injection layer 109, the hole transport layer 110, the light-emitting layers 111, the electron transport layer 112, and the electron injection layer 113, which have been described above, are equivalent to the forming the functional layers of the present invention.

Figure 15D:
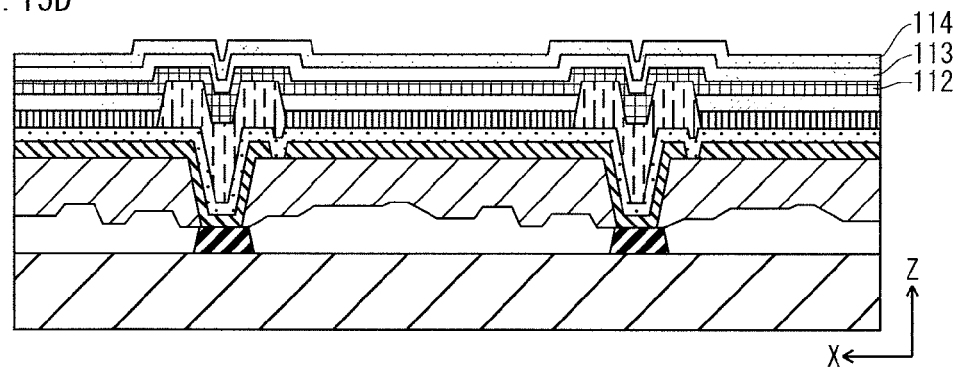

Next, material of a common electrode 114 is formed on a surface of the electron injection layer 113 by the vacuum deposition method, the sputtering method, or the like. As a result, the common electrode 114 is formed (FIG. 15D). A step of forming the common electrode 114 is equivalent to the forming the second electrode of the present invention.

Although not shown in the figure, a sealing layer is formed on a surface of the common electrode 114 using light-transmissive material such as SiN and SiON by the sputtering method, a CVD method, or the like.

The organic EL device 100 is complete through the above steps.

<Application Step>

As described above, the hole transport layer 110 and the light-emitting layers 111 are each formed by preparing ink containing material of layer and solvent and applying the ink, and evaporating and drying the solvent, and further heating and baking the solvent as necessary. The following describes in detail the application step for particularly forming the light-emitting layers 111.

(Ink Jet Device 1000)

The application step is performed using the ink jet device relating to the present invention described in Embodiment 1. The ink jet device has the configuration as described above with reference to FIG. 1 to FIG. 3. The application step is performed by the ink jet method using the ink jet device 1000 shown in FIG. 1. In the present embodiment, the ink jet device 1000 includes a plurality of head units 30 which are not illustrated, and the head units 30 each correspond to a different type of ink and each include a plurality of ink jet heads 301. Here, description is give on the case where the elongated apertures 117 are arranged so as to have long sides intersecting with the scanning direction (the column (Y) direction) of the head units 30 (the ink jet heads 301) at a predetermined angle.

(Positional Relationship Between Head Units 30 and Apertures of Application Target Substrate)

Figure 16:
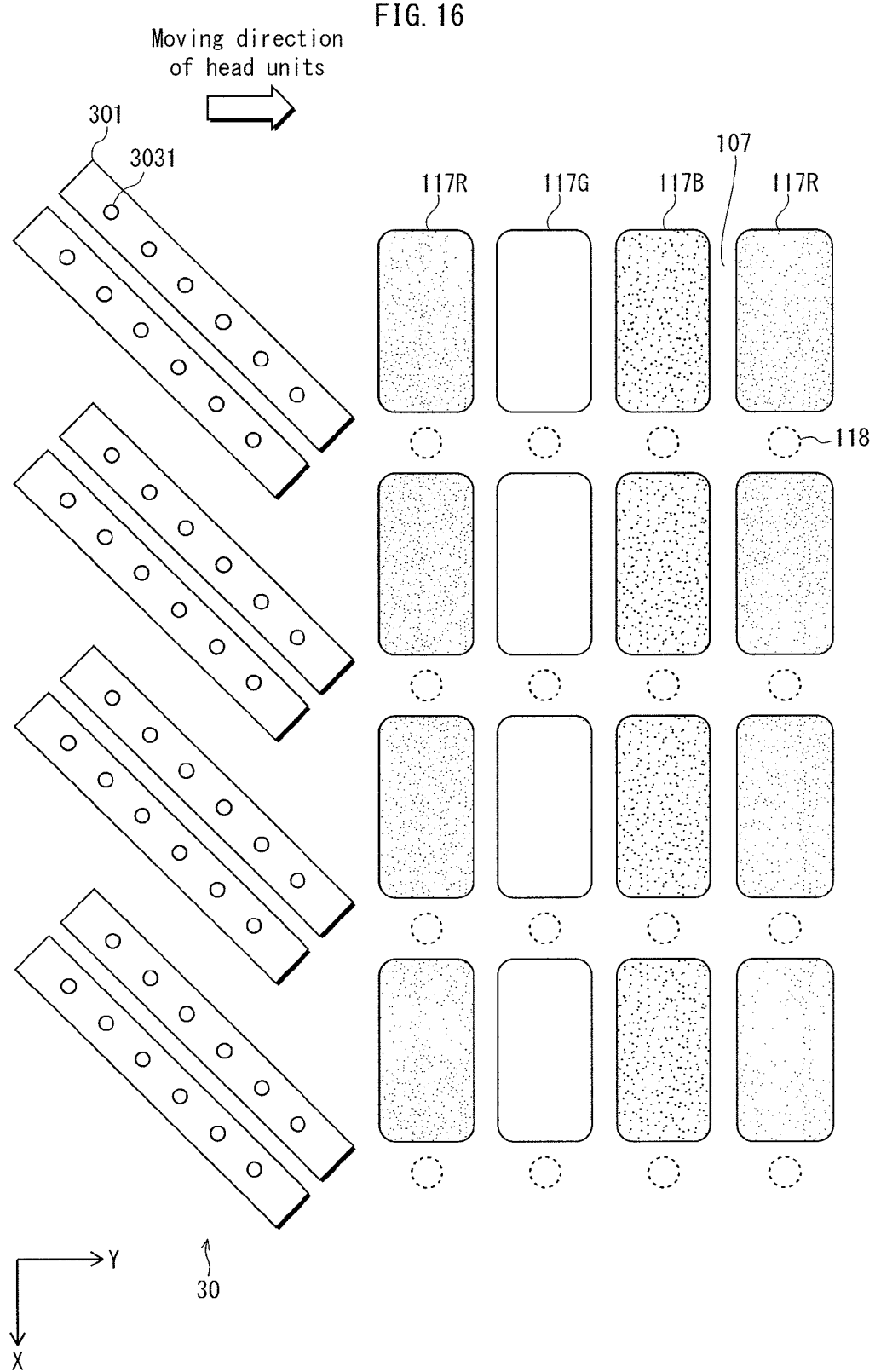
FIG. 16 shows positional relationship between an application target substrate and an ink head units 301 in an application step of the manufacturing method of the organic EL device 100.

FIG. 16 shows the positional relationship between the head units 30 and an application target substrate in the manufacturing step of the organic EL display panel.

In FIG. 16, the application target substrate is placed on the right side of the head units 30. The application target substrate is in the state of not yet undergoing the application step. In other words, the application target substrate is in the state of having provided therein the barrier rib layer 107 in which the apertures 117 are formed in units of pixels in matrix. The ink jet heads 301 each include a plurality of nozzles 3031 through which ink droplets are ejected. The nozzles 3031 are arranged in the row (X) direction at a predetermined pitch. Here, an application pitch in relation to the nozzles 3031 is adjusted by changing the angle of the ink jet heads 301 relative to the row (X) direction.

In the present embodiment as shown in FIG. 16, the ink jet heads 301 each include the six nozzles 3031 which are arranged in row in the longitudinal direction. Five ones of the six nozzles 3031 correspond to one of the apertures 117 (one of the apertures 117R, 117G, and 117B). The head units 30 of the ink jet device 1000 shown in FIG. 16 each correspond to one type of the apertures 117 (one of the apertures 117R, 117G, and 117B). Although not shown in the figure, the head units 30 with the same configuration correspond to the remaining two types of the apertures 117. In other words, the head units 30 each include the plurality of ink jet heads 301 each housing therein ink corresponding to one of the luminescent colors (the R, G, and B colors) of the light-emitting layers.

In the application step, defined ink droplets are ejected through the nozzles 3031, which correspond to the apertures 117, to the apertures 117 by causing the inkjet heads 301 to scan in the column (Y) direction. The light-emitting layers 111 are formed through the above step of forming the light-emitting layers 111. At this stage, the total amount of the ejected droplets needs to be uniform between the adjacent apertures 117.

The hole transport layer 110 is formed in the application step similar to that of the light-emitting layers 111. However, a single type of ink is used in the application step of the hole transport layer 110, differently from that of the light-emitting layer 111. Accordingly, in the application of the hole transport layer 110 as shown in FIG. 16, ink droplets are ejected by causing only the inkjet heads 301 to scan, which are included in one of the head units 30 and house therein the single type of ink.

(Drive Voltage)

The materials of the light-emitting layers 111 each correspond to one of the luminescent colors (the R, G, and B colors). Accordingly, in the application step for forming the light-emitting layers 111, application is performed by causing the ink jet heads 301 housing therein inks corresponding to the luminescent colors to scan. The physical properties of the ink of course differ for each corresponding luminescent color. For example, in the case where a droplet of ink corresponding to the luminescent color R has a longer trail than trails of droplets of inks corresponding to the other luminescent colors and as a result landing accuracy of the droplet of the ink corresponding to the luminescent color R is lower than the droplets of the inks corresponding to the other luminescent colors, drive voltage having the waveform configuration including the preliminary oscillatory waveform part and the main oscillatory waveform part (for example, FIG. 8A) is applied to the piezoelectric element of the ink jet head 301 in which the ink corresponding to the luminescent color R is housed. With respect to the ink jet heads 301 in which the inks corresponding to the other luminescent colors are housed, drive voltage having the waveform configuration not including the preliminary oscillatory waveform part (for example, FIG. 4A) is applied without performance of the preliminary drive operation. In this way, drive voltage having the waveform configuration including the preliminary oscillatory waveform part is applied in accordance with physical properties of ink housed in the ink jet head 301. As a result, as described in the section (Relationship between Physical Properties of Ink and Preliminary Drive Operation), it is possible to improve the landing accuracy of the ink droplet, thereby improving the manufacturing yield. Also, increase in drive frequency increases the manufacturing efficiency, but tends to deteriorates landing accuracy. For this reason, with respect to the ink jet head 301 in which ink is housed which shows lower landing accuracy of an ink droplet in the high frequency domain, drive voltage having the waveform configuration including the preliminary oscillatory waveform part and the main oscillatory waveform part (for example, FIG. 8A) is applied to the piezoelectric element. With respect to the remainder of the ink jet heads 301, drive voltage having the waveform configuration not including the preliminary oscillatory waveform part (for example, FIG. 4A) is applied to the piezoelectric element without performance of the preliminary drive operation. As a result, as described in the section (Relationship between Drive Frequency and Preliminary Drive Operation), it is possible to improve the landing accuracy of the ink droplet, thereby improving the manufacturing yield.

The hole transport layer 110 is formed in the application step similarly to the light-emitting layers 111. Specifically, drive voltage having the waveform configuration including the preliminary oscillatory waveform part and the main oscillatory waveform part is applied in accordance with the physical properties of the used ink. For example, in the case where ink containing material of the hole transport layer 110 is lower in terms of viscosity than respective inks corresponding to the luminescent colors (the R, G, and B colors) and is lower in terms of landing accuracy of an ink droplet than the respective inks corresponding to the luminescent colors, drive voltage having the waveform configuration including the preliminary oscillatory waveform part and the main oscillatory waveform part (for example, FIG. 8A) is applied to the piezoelectric element of the ink jet head 301 in which the ink having the lower viscosity is housed. As a result, it is possible to improve the landing accuracy of the ink droplet, thereby improving the manufacturing yield. Similarly, in the case where ink shows lower landing accuracy of an ink droplet due to drive frequency, drive voltage having the waveform configuration including the preliminary oscillatory waveform part and the main oscillatory waveform part (for example, FIG. 8A) is applied to the piezoelectric element of the ink jet head 301 in which the ink having the deteriorated landing accuracy is housed. As a result, it is possible to improve the landing accuracy of the ink droplet, thereby improving the manufacturing yield.

As described above, drive voltage having the waveform configuration including the preliminary oscillatory waveform part and the main oscillatory waveform part (for example, FIG. 8A) is applied to the piezoelectric element, in accordance with the physical properties of the ink used for each of the light-emitting layers 111 and the hole transport layer 110 or the drive frequency. Light-emitting layers of an organic EL device have thickness of some ten nm order. Accordingly, when an ink droplet having volume smaller than the defined volume is ejected, or when a flight course of an ink droplet is deflected, ununiform film thickness of the light-emitting layers is easily caused. This further causes ununiform luminance, and as a result the manufacturing yield extremely decreases. The same applies to the hole transport layer. Accordingly, it is possible to improve the manufacturing yield of the organic EL device by performing the application process with use of the ink jet device relating to the present invention, as described in the present embodiment.

In the present embodiment, in forming the hole transport layer and the light-emitting layers corresponding to the luminescent colors, the waveform configuration of drive voltage does not vary for an ink jet head during a time period from start to completion of application. However, the application step is not limited to this. Alternatively, drive voltage having the waveform configuration including the main oscillatory waveform part and not including the preliminary oscillatory waveform part may be applied first, and then drive voltage having the waveform configuration including the preliminary oscillatory waveform part and the main oscillatory waveform part (for example, FIG. 8A) may be applied for a predetermined time period since the start of the application. The above application step can be used in a case where volume of ink adhering near the nozzle increases at a time after elapse of a predetermined time period since the start of application.

<Others>

The specific description has been provided on the ink jet device and the manufacturing method of the organic EL device relating to the above embodiments of the present invention. It should be noted, however, that the above embodiments are merely examples used to describe the effects of the structure of the present invention. Therefore, the present invention should not be construed as being limited to the above embodiments.

The plurality of ink jet heads of the ink jet device may house therein inks that have the same physical properties or inks that have different physical properties. The ink jet device may include the plurality of ink jet heads according to the following configuration for example: the head unit 30 shown in FIG. 1 is provided in plural, each of the gantry unit 210 and the movable member 220 are provided for each of the head units 30, and the ink jet head units 30 are each connected to the control device 15. Also, the ink jet head units 30 each may include a plurality of nozzles. Alternatively, for example as shown in the region F in FIG. 3B, the ink jet head 30 may include only one nozzle corresponding to one piezoelectric element.

With respect to at least one of the ink jet heads, drive voltage may be applied, which has the waveform configuration including the preliminary oscillatory waveform part and the main oscillatory waveform. With respect to a remainder of the ink jet heads, drive voltage may be applied, which has the waveform configuration including the main oscillatory waveform without performance of the preliminary drive operation, or alternatively the preliminary drive operation may be performed.

The pressure application unit for discharging an ink droplet by applying pressure to ink housed in the ink housing unit is not limited to being supported by the piezoelectric system with a piezoelectric element as described in the above embodiments. Alternatively, the pressure application unit may be supported by any drive system such as the thermal system and the pump system according to which an ink droplet is ejected by application of positive pressure to an ink surface. For example, in the case where the thermal system is used according to which pressure is applied by bubbles resulting from evaporating ink housed in the ink housing unit, a heater may be used as the pressure application unit. Also, in the above embodiments, the flexural oscillator employing the piezoelectric system is used as the pressure application unit. Alternatively, the pressure application unit may be for example a longitudinal oscillator. Further alternatively, the pressure application unit may be constituted from a plurality of piezoelectric elements stacked on an oscillation plate, instead of only a piezoelectric element.

In the above embodiments as shown in FIG. 5A, the drive waveform of the drive voltage includes the preliminary oscillatory waveform part and the main oscillatory waveform part, each of which correspond to the pull ejection method, and the oscillation suppression waveform part. Alternatively, the drive waveform of the drive voltage may include the main oscillatory waveform part corresponding to the push ejection method (FIG. 6A), or may include the preliminary oscillatory waveform part corresponding to the push ejection method (FIG. 6C). Further alternatively, the drive waveform of the drive voltage may not include the oscillation suppression waveform part (FIG. 6B).

In the above embodiments, the device configuration of the organic EL device has been described as being of the top emission type. Accordingly, the cathode has been described as being made of light-transmissive conductive material such as ITO and IZO. However, the device configuration of the organic EL device relating to the present invention is not limited to these. Alternatively, the organic EL device may be of the bottom emission type, and the cathode may be made of metal material such as aluminum. Also, each functional layer is not limited to be constituted from any one of the hole injection layer, the hole transport layer, the light-emitting layers, the electron transport layer, and the electron injection layer. Alternatively, the functional layer only needs to include at least the light-emitting layers that are formed through application.

In the above embodiments, the organic EL device that is to be manufactured by the manufacturing method of the organic EL device has been described as an organic EL display panel. However, the organic EL device targeted by the present invention is not limited to this, and alternatively may be an organic EL device including a single organic EL element.

INDUSTRIAL APPLICABILITY

The ink jet device relating to the present invention is utilizable in an application step in forming an organic film of an organic imaging element, an organic EL element that is an organic EL device, and so on, and is in particular utilizable preferably in an application step in manufacturing a device with a large-size substrate such as an organic EL display panel that is an organic EL device.

REFERENCE SIGNS LIST 15 control device
20 ink jet table
30 head unit
40 ink
100 organic EL device
101 substrate body
102 TFT layer
103 feed electrode
104 planarizing film
105 substrate
106 pixel electrode
107 barrier rib layer
109 hole injection layer
110 hole transport layer
111 light-emitting layer
112 electron transport layer
113 electron injection layer
114 common electrode
115 organic EL element
210 gantry unit
213 control unit
220 movable member 300 ejection control unit
301 ink jet head
301e ink housing unit
301h oscillation plate
302 body
1000 ink jet device
3010 pressure application unit
3031 nozzle

The invention claimed is:

1. An ink jet device comprising:
a plurality of ink jet heads each including an ink housing that houses therein ink, a pressure applicator that ejects a droplet of the ink by applying pressure to the ink, and a nozzle through which the droplet of the ink is ejected, a droplet of ink to be ejected from the at least one ink jet head differs in terms of physical properties from a droplet of ink to be ejected from a remainder of the plurality of ink jet heads, wherein
with respect to at least one of the plurality of ink jet heads, a preliminary drive operation and a main drive operation are performed,
the preliminary drive operation is an operation of pushing the ink toward an outer edge of the nozzle to the extent that the droplet of the ink is not ejected through the nozzle, and
the main drive operation is an operation of ejecting the droplet of the ink through the nozzle after performance of the preliminary drive operation.

2. The ink jet device of claim 1, wherein
the pressure applicator included in the at least one ink jet head has a piezoelectric element for applying pressure to the ink,
the ink jet device further comprises an ejection controller that controls ejection of the droplet of the ink by applying voltage to the piezoelectric element according to a voltage waveform, and
the voltage waveform of the voltage includes a preliminary oscillatory waveform part for performing the preliminary drive operation and a main oscillatory waveform part for performing the main drive operation.

3. The ink jet device of claim 2, wherein
a proportion of a displacement amount X of voltage to be applied for performing the preliminary drive operation to a displacement amount Y of voltage to be applied for performing the main drive operation is set so as to satisfy 30%≤X/Y≤50%.

4. The ink jet device of claim 3, wherein
the voltage waveform of the voltage to be applied to the piezoelectric element of the at least one ink jet head further includes an oscillation suppression waveform part for performing an oscillation suppression operation of suppressing oscillation occurring on a surface of the ink due to the main drive operation, and
with respect to the at least one ink jet head, the ejection controller performs the oscillation suppression operation according to the oscillation suppression waveform part.

5. The ink jet device of claim 3, wherein
a surface of the ink at a start time of the main drive operation after performance of the preliminary drive operation is positioned more downward than the surface of the ink at a start time of the main drive operation without performance of the preliminary drive operation.

6. The ink jet device of claim 1, wherein
the physical properties include viscosity, and
the droplet of the ink to be ejected from the at least one ink jet head has a lower viscosity than the droplet of the ink to be ejected from the remainder of the plurality of ink jet heads.

7. The ink jet device of claim 1, wherein
the physical properties include occurrence of a linear trail extending backward from part of the droplet of the ink in an ejection direction, and
the droplet of the ink to be ejected from the at least one ink jet head has a longer trail than the droplet of the ink to be ejected from the remainder of the plurality of ink jet heads.

8. An ink jet device comprising:
a plurality of ink jet heads each including an ink housing that houses therein ink, a pressure applicator that ejects a droplet of the ink by applying pressure to the ink, and a nozzle through which the droplet of the ink is ejected, wherein
with respect to at least one of the plurality of ink jet heads, a preliminary drive operation and a main drive operation are performed,
the preliminary drive operation is an operation of pushing the ink toward an outer edge of the nozzle to the extent that the droplet of the ink is not ejected through the nozzle,
the main drive operation is an operation of ejecting the droplet of the ink through the nozzle after performance of the preliminary drive operation,
the pressure applicator included in the at least one ink jet head has a piezoelectric element for applying pressure to the ink,
the ink jet device further comprises an ejection controller that controls ejection of the droplet of the ink by applying voltage to the piezoelectric element according to a voltage waveform,
the voltage waveform of the voltage includes a preliminary oscillatory waveform part for performing the preliminary drive operation and a main oscillatory waveform part for performing the main drive operation,
the pressure applicator included in each of the plurality of ink jet heads has the piezoelectric element, and
the at least one ink jet head differs from the remainder of the plurality of ink jet heads in terms of frequency of voltage to be applied to the piezoelectric element.

9. The ink jet device of claim 8, wherein
the voltage to be applied to the piezoelectric element of the at least one ink jet head has frequency of 10 kHz or higher.

10. A method of manufacturing an organic electro luminescence (EL) device comprising:
forming a first electrode on a substrate;
forming one or more functional layers including a light-emitting layer on the first electrode;
forming a second electrode on the functional layers, wherein
in the forming of the functional layers, the functional layers are formed by applying ink including material of the functional layer and solvent with use of the ink jet device of claim 8, and at least evaporating and drying the solvent.

11. A method of manufacturing an organic electro luminescence (EL) device comprising:
forming a first electrode on a substrate;
forming one or more functional layers including a light-emitting layer on the first electrode;
forming a second electrode on the functional layers, wherein in the forming of the functional layers, the functional layers are formed by applying ink including material of the functional layer and solvent with use of an ink jet device, and at least evaporating and drying the solvent;

the ink jet device including, a plurality of ink jet heads each including an ink housing that houses therein ink, a pressure applicator that ejects a droplet of the ink by applying pressure to the ink, and a nozzle through which the droplet of the ink is ejected, wherein with respect to at least one of the plurality of ink jet heads, a preliminary drive operation and a main drive operation are performed, the preliminary drive operation is an operation of pushing the ink toward an outer edge of the nozzle to the extent that the droplet of the ink is not ejected through the nozzle, and the main drive operation is an operation of ejecting the droplet of the ink through the nozzle after performance of the preliminary drive operation.

* * * * *